(12) United States Patent
Kim et al.

(10) Patent No.: US 11,700,748 B2
(45) Date of Patent: Jul. 11, 2023

(54) DISPLAY PANEL HAVING REDUCED LIGHT DISTORTION AND ELECTRIC APPARATUS INCLUDING THE SAME

(71) Applicant: Samsung Display Co., Ltd., Yongin-si (KR)

(72) Inventors: Taejoon Kim, Yongin-si (KR); Jinoh Kwag, Yongin-si (KR); Hyeyong Chu, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 246 days.

(21) Appl. No.: 17/098,181

(22) Filed: Nov. 13, 2020

(65) Prior Publication Data

US 2021/0257594 A1     Aug. 19, 2021

(30) Foreign Application Priority Data

Feb. 14, 2020    (KR) ........................ 10-2020-0018569

(51) Int. Cl.
*H10K 50/858*       (2023.01)
*H10K 59/126*       (2023.01)
(Continued)

(52) U.S. Cl.
CPC ......... *H10K 50/858* (2023.02); *H10K 59/126* (2023.02); *H10K 59/65* (2023.02); *H10K 2102/351* (2023.02)

(58) Field of Classification Search
CPC ................ H01L 27/32–3293; H01L 51/50–56
See application file for complete search history.

(56) References Cited

U.S. PATENT DOCUMENTS

| | | |
|---|---|---|
| 7,994,714 B2 | 8/2011 | Cok et al. |
| 9,337,247 B2 | 5/2016 | Choi et al. |
| (Continued) | | |

FOREIGN PATENT DOCUMENTS

| | | |
|---|---|---|
| KR | 10-2017-0080295 A | 7/2017 |
| KR | 10-2018-0003244 A | 1/2018 |
| KR | 10-2018-0126883 A | 11/2018 |

OTHER PUBLICATIONS

CN 107230746 A, published Oct. 3, 2017.*
Machine translation of CN 107230746.*

*Primary Examiner* — Suberr L Chi
(74) *Attorney, Agent, or Firm* — Lewis Roca Rothgerber Christie LLP

(57) ABSTRACT

Provided are a display panel and an electronic apparatus including the same. The display panel has a transmittance area and an expanded display area to enable the representation of images in an area where an electronic component is located and, for example, to remove or decrease the distortion by diffracted light among the light received by the electronic component when the electronic component is an electronic component (e.g., a camera) using light. The display panel includes: a substrate; first pixel circuits and second pixel circuits on the substrate and spaced apart from one another with the transmittance area therebetween, and each including a thin film transistor and a storage capacitor; first and second display elements electrically respectively coupled to the first and second pixel circuits; and a first phase shift layer between the substrate and the first and second pixel circuits and having a first light transmittance.

20 Claims, 21 Drawing Sheets

(51) Int. Cl.
*H10K 59/65* (2023.01)
*H10K 102/00* (2023.01)

(56) References Cited

U.S. PATENT DOCUMENTS

| | | | |
|---|---|---|---|
| 2013/0257268 A1* | 10/2013 | Li | H10K 50/86 |
| | | | 313/506 |
| 2017/0005155 A1* | 1/2017 | You | H01L 21/32133 |
| 2018/0006274 A1 | 1/2018 | Kim et al. | |
| 2018/0337219 A1 | 11/2018 | Rhee et al. | |
| 2021/0249494 A1* | 8/2021 | You | H01L 27/3272 |

* cited by examiner

II

DISPLAY PANEL HAVING REDUCED LIGHT DISTORTION AND ELECTRIC APPARATUS INCLUDING THE SAME

CROSS-REFERENCE TO RELATED APPLICATION

This application claims priority to and the benefit of Korean Patent Application No. 10-2020-0018569, filed on Feb. 14, 2020, in the Korean Intellectual Property Office, the entire content of which is hereby incorporated by reference.

BACKGROUND

1. Field

Embodiments of the present disclosure relate to a display panel and an electronic apparatus including the same, and, for example, to a display panel of which a display area is expanded to enable the representation of images in an area where an electronic component is located, and an electronic apparatus including the display panel.

2. Description of Related Art

Recently, display apparatuses have been used in various fields. Also, as the thickness and weight of display apparatuses have been reduced, the range of use of the display apparatuses has increased.

An increase in the occupied areas of display areas in display apparatuses results in the addition of functions embedded onto or linked with the display apparatuses. To add various functions while increasing the areas of the display areas, research has been conducted into display apparatuses in which various components can be arranged in their display areas.

SUMMARY

To add diverse functions to a display apparatus, an electronic component such as a camera or a sensor may be in a display area of the display apparatus. According to one or more embodiments of the disclosure, the disclosure provides a display panel including an expanded display panel to enable the representation of images even in an area where an electronic component is located, and an electronic apparatus including the display panel. However, this is merely an example, and one or more embodiments of the disclosure are not limited thereto.

Additional aspects of embodiments will be set forth in part in the description which follows and, in part, will be apparent from the description, or may be learned by practice of the embodiments presented in this disclosure.

According to an aspect of an embodiment of the disclosure, a display panel includes a transmittance area and includes: a substrate; first pixel circuits and second pixel circuits on the substrate and spaced apart from one another, and each including a thin film transistor and a storage capacitor; first display elements electrically coupled to the first pixel circuits, respectively; second display elements electrically coupled to the second pixel circuits, respectively; and a first phase shift layer between the substrate and the first pixel circuits and the second pixel circuits and having a first light transmittance.

The first phase shift layer may include at least one selected from the group consisting of transition metals, silicon compounds, transition metal oxides, transition metal nitrides, transition metal oxynitrides, transition metal carbides, and transition metal oxynitride carbides.

The first light transmittance of the first phase shift layer in a visible light band may be in a range of about 3 and about 80.

A first thickness of the first phase shift layer may have a value in a range of about 1000 Å to about 3000 Å.

A first refractive index of the first phase shift layer may be in a range of about 1.5 and about 4.0, and a first extinction coefficient of the first phase shift layer may be in a range of about 0.01 and about 2.0.

The first phase shift layer may include a first sub-phase shift layer overlapping the first pixel circuit, and a second sub-phase shift layer overlapping the second pixel circuit, and the first sub-phase shift layer and the second sub-phase shift layer may be spaced apart from each other.

The display panel may further include a light-blocking layer on the first phase shift layer, wherein the light-blocking layer may have a second light transmittance that is less than the first light transmittance.

An edge of the first phase shift layer may be closer to the transmittance area than an edge of the light-blocking layer, and the edge of the first phase shift layer and the edge of the light-blocking layer may form a step difference.

The display panel may further include a second phase shift layer on the light-blocking layer and overlapping the light-blocking layer and the first phase shift layer.

An edge of the second phase shift layer may be closer to the transmittance area than the edge of the first phase shift layer.

The display panel may further include a second phase shift layer between the first phase shift layer and the light-blocking layer.

The edge of the first phase shift layer may be closer to the transmittance area than an edge of the second phase shift layer.

The edge of the second phase shift layer may be elongated further towards the transmittance area than the edge of the first phase shift layer.

Each of the first phase shift layer and the second phase shift layer may include at least one selected from the group consisting of transition metals, silicon compounds, transition metal oxides, transition metal nitrides, transition metal oxynitrides, transition metal carbides, and transition metal oxynitride carbides, and a material or a composition ratio of the second phase shift layer may differ from a material or a composition ratio of the first phase shift layer.

The display panel may further include a light-blocking band layer between the light-blocking layer and the transmittance area and spaced apart from the light-blocking layer.

The display panel may further include a reflection prevention layer under the first phase shift layer, corresponding to the pixel circuit.

According to another aspect of an embodiment of the disclosure, there is provided an electronic apparatus including: a display panel including a transmittance area; and an electronic component overlapping the transmittance area, wherein the display panel includes: a substrate; first pixel circuits and second pixel circuits on the substrate and spaced apart from each other with the transmittance area between the first and second pixel circuits, and each including a thin film transistor and a storage capacitor; first display elements electrically respectively coupled to the first pixel circuits; second display elements electrically respectively coupled to the second pixel circuits; and a first phase shift layer between the substrate and the first and second pixel circuits and having a first light transmittance.

The electronic apparatus may further include a light-blocking layer on the first phase shift layer, wherein an edge of the first phase shift layer may be closer to the transmittance area than an edge of the light-blocking layer, and the edge of the first phase shift layer and the edge of the light-blocking layer may form a step difference.

The electronic apparatus may further include a second phase shift layer on the first phase shift layer.

Each of the first phase shift layer and the second phase shift layer may include at least one selected from the group consisting of transition metals, silicon compounds, transition metal oxides, transition metal nitrides, transition metal oxynitrides, transition metal carbides, and transition metal oxynitride carbides, and a material or a composition ratio of the second phase shift layer may differ from a material or a composition ratio of the first phase shift layer.

Other aspects and features of embodiments other than those described above will become apparent from the following detailed description, claims and drawings for carrying out the disclosure.

BRIEF DESCRIPTION OF THE DRAWINGS

The above and other aspects and features of certain embodiments of the disclosure will be more apparent from the following description taken in conjunction with the accompanying drawings, in which.

DETAILED DESCRIPTION

Figure 1:
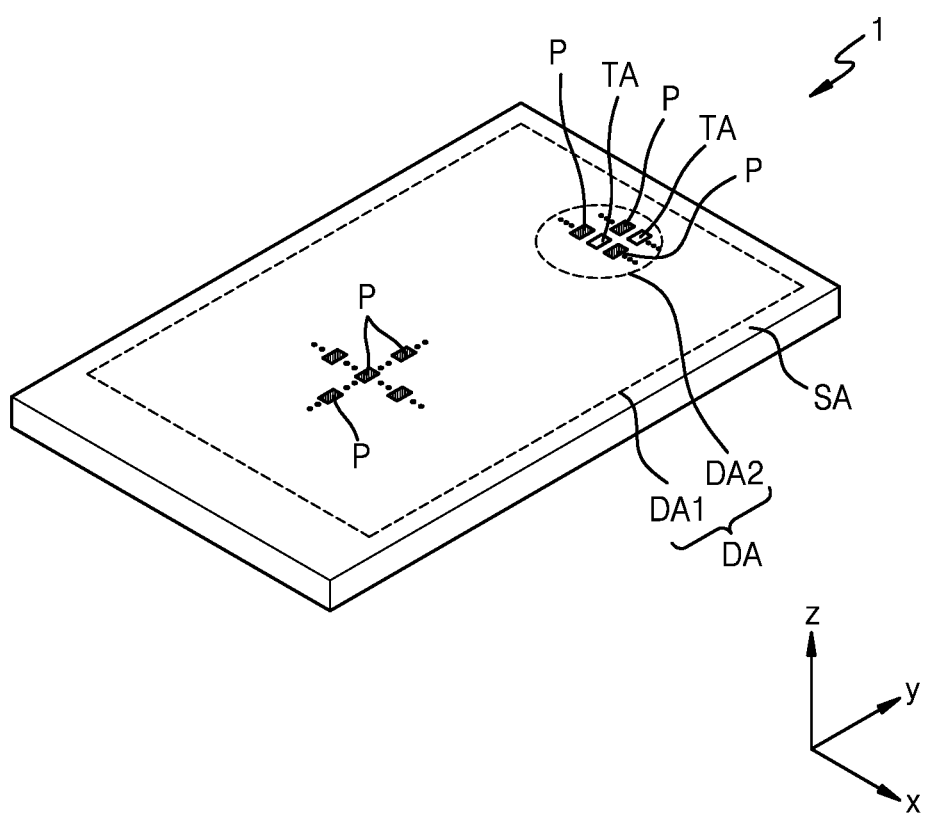
FIG. 1 is a schematic perspective view of an electronic apparatus including a display panel, according to an embodiment.

Reference will now be made in more detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of embodiments of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The disclosure will now be described more fully with reference to the accompanying drawings, in which embodiments of the disclosure are shown. Like reference numerals in the drawings denote like elements, and thus, duplicative description thereof will not be repeated.

It will be understood that although the terms "first," "second," etc. may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "on" or "formed on" another layer, region, or component, it can be directly or indirectly on or formed on the other layer, region, or component. That is, for example, intervening layers, regions, or components may be present.

Sizes of components in the drawings may be exaggerated for convenience of explanation. In other words, because sizes and thicknesses of components in the drawings may be arbitrarily illustrated for convenience of explanation, the following embodiments are not limited thereto.

When a certain embodiment may be implemented differently, a set or specific process order may be performed differently from the described order. For example, two consecutively described processes may be performed substantially at the same time or performed in an order opposite to the described order.

In the present specification, an expression such as "A and/or B" indicates A, B, or A and B. Also, an expression such as "at least one of A and B" indicates A, B, or A and B.

It will be understood that when a component, such as a layer, a film, a region, or a plate, is referred to as being "connected to" or "coupled to" another component, the component can be directly on the other component or intervening components may be present thereon. For example, it will be understood that when a component, such as a layer, a film, a region, or a plate, is referred to as being "electrically connected to" or "electrically coupled to" another component, the component can be electrically directly on the other component or intervening components may be present thereon for an indirect electrical connection.

It will be understood that when a component, such as a layer, a film, a region, or a plate, is referred to as being "on" another component, the component can be directly on the other component or intervening components may be present thereon. For example, the x-axis, the y-axis, and the z-axis may be perpendicular to one another, or may represent different directions that are not perpendicular to one another.

FIG. 1 is a schematic perspective view of an electronic apparatus including a display panel, according to an embodiment.

Referring to FIG. 1, an electronic apparatus 1 may include a display area DA and a surrounding area SA outside the display area DA. The electronic apparatus 1 may provide images through an array of pixels P arranged in the display area DA two-dimensionally. The pixels P may be arranged in a first display area DA1 and a second display area DA2, and arrays of the pixels P arranged in the first display area DA1 and the second display area DA2 may differ. For example, as a transmittance area TA (e.g., a light transmittance area) is between the pixels P arranged in the second display area DA2, the array of the pixels P of the second display area DA2 may differ from the array of the pixels P of the first display area DA1.

The electronic apparatus 1 may provide a first image by using light emitted from the pixels P in the first display area DA1 and a second image by using light emitted from the pixels P in the second display area DA2. In some embodiments, the first image and the second image may be respective portions of any one of the images provided through the display area DA of the electronic apparatus 1. In some embodiments, the electronic apparatus 1 may provide the first image and the second image that are independent from each other.

The second display area DA2 may include the transmittance area TA located between the pixels P. The transmittance area TA may be an area where light may penetrate and where no pixels are arranged.

The surrounding area SA may be an area where no images are provided and may surround the entire display area DA. In the surrounding area SA, a driver, etc. for providing electrical signals or power to the pixels P may be arranged. In the surrounding area SA, a pad may be located, wherein the pad may be an area where an electronic device, a printed circuit board, and/or the like may be electrically coupled.

As shown in FIG. 1, a shape of the second display area DA2 may be a circle (e.g., substantially a circle) on a plane or may be an oval, but the present disclosure is not limited thereto. For example, in some embodiments, the shape of the second display area DA2 may be a polygon such as a rectangle or a bar.

The second display area DA2 may be on an inner side or one side of the first display area DA1. As shown in FIG. 1, the entire second display area DA2 may be surrounded by the first display area DA1. In some embodiments, the second display area DA2 may be partially surrounded by the first display area DA1. For example, the second display area DA2 may be on one side of the first display area DA1 and may be partially surrounded by the first display area DA1.

A ratio of the second display area DA2 to the display area DA may be smaller than a ratio of the first display area DA1 to the display area DA. As shown in FIG. 1, the electronic apparatus 1 may include the second display area DA2 or may include two or more second display areas DA2.

The electronic apparatus 1 may include a mobile phone, a tablet PC, a laptop, a smart watch or smart band that is a wrist-wearable gadget, and/or the like.

Figure 2A:
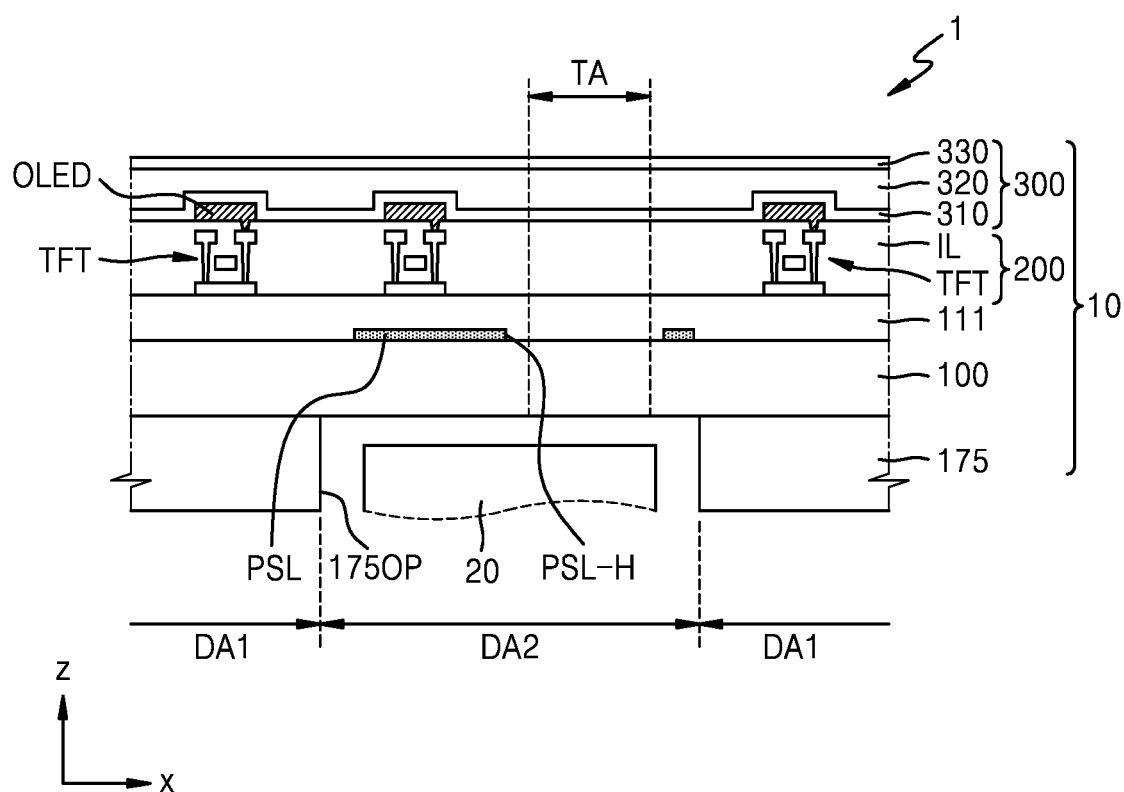
FIGS. 2A and 2B are schematic cross-sectional views of a portion of the electronic apparatus including a display panel, according to an embodiment.
Figure 2B:
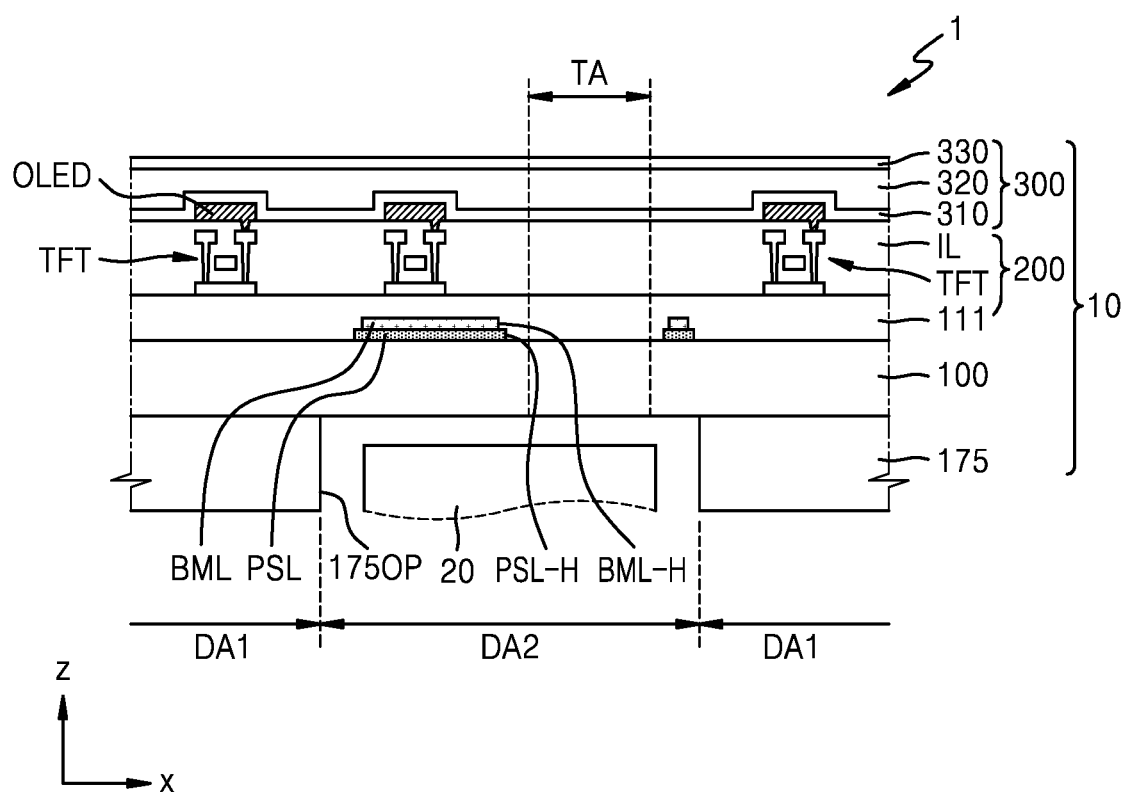

FIGS. 2A and 2B are schematic cross-sectional views of a portion of the electronic apparatus including a display panel, according to an embodiment.

Referring to FIGS. 2A and 2B, the electronic apparatus 1 may include a display panel 10 and an electronic component 20 overlapping the display panel 10.

The display panel 10 may include a substrate 100, a display layer 200 on the substrate 100, and a thin film encapsulation layer 300 on the display layer 200.

The electronic component 20 may be in the second display area DA2. The electronic component 20 may be an electronic component using light and/or sound. For example, the electronic component may be a sensor, for example, a proximity sensor, which measures a distance, a sensor (e.g., a fingerprint, a iris, a face, etc.) recognizing a body part of the user, a small lamp outputting light, an image sensor (e.g., a camera) capturing images, and/or the like. The electronic component using light may use light having various suitable wavelength bands, for example, visible rays, infrared rays, ultraviolet rays, etc. The electronic component using sound may use ultrasonic waves and/or sound having different wavelength bands. In some embodiments, the electronic component 20 may include sub-components such as a light emitter and a light receiver. The light emitter and/or the light receiver may be integrally formed or physically separated, and a pair of the light emitter and the light receiver may form one electronic component 20.

The substrate 100 may include glass and/or polymer resin. For example, examples of the polymer resin of the substrate 100 may include polyether sulfone, polyacrylate, polyether imide, polyethylene naphthalate, polyethylene terephthalate, polyphenylene sulfide, polyarylate, polyimide, polycarbonate, cellulose acetate propionate, and/or the like. The substrate 100 including polymer resin may be flexible, rollable, and/or bendable. The substrate 100 may have a multilayered structure including a layer including the aforementioned polymer resin and an inorganic layer.

The display layer 200 may be on a front surface of the substrate 100, and a lower protection film 175 may be on a rear surface of the substrate 100. The lower protection film 175 may be attached to the rear surface of the substrate 100. An adhesive layer may be between the lower protection film 175 and the substrate 100. In some embodiments, the lower protection film 175 may be directly formed on the rear surface of the substrate 100, and in this case, the adhesive layer may not be between the lower protection film 175 and the substrate 100.

The lower protection film 175 may support and protect the substrate 100. The lower protection film 175 may include an opening 1750P corresponding to the second display area DA2. The opening 1750P of the lower protection film 175 may be a concave portion formed due to a removal of a portion of the lower protection film 175 in a thickness direction. In some embodiments, the opening 1750P of the lower protection film 175 may be formed as a portion of the lower protection film 175 is entirely removed in the thickness direction, and in this case, the opening 1750P may have a shape of a through hole as shown in FIGS. 2A and 2B. In some embodiments, the opening 1750P of the lower protection film 175 may have a shape of a blind hole as a portion of the lower protection film 175 is partially removed in the thickness direction.

Due to the opening 1750P of the lower protection film 175, the transmittance of the second display area AD2, for example, the light transmittance of the transmittance area TA, may be improved. The lower protection film 175 may include an organic insulating material such as polyethylene terephthalate (PET) and/or polyimide The display layer 200 may define the pixels. The pixel may be an area where red light, green light, or blue light may be emitted, and each pixel may include a display element. The display element of each pixel may include an organic light-emitting diode OLED, and the organic light-emitting diode OLED may emit light of different colors, for example, red, green, or blue, according to types or compositions of organic materials included in the organic light-emitting diode OLED.

The display layer 200 may include a display element layer including the organic light-emitting diode OLED that is a display element, a circuit layer including a thin film transistor TFT electrically coupled to the organic light-emitting diode OLED, and an insulating layer IL. In each of the first display area DA1 and the second display area DA2, the thin film transistor TFT and the organic light-emitting diode OLED electrically coupled to the thin film transistor TFT may be located, respectively.

The second display area DA2 may include the transmittance area TA where the thin film transistor TFT and the organic light-emitting diode OLED are not located. The transmittance area TA may be an area where light emitted from the electronic component 20 and/or light directed thereto may penetrate (e.g., may be transmitted). In the display panel 10, the light transmittance of the transmittance area TA may be equal to or greater than about 30%, about 40%, about 50%, about 60%, about 75%, about 80%, about 85%, or about 90%.

A phase shift layer PSL may be between the substrate 100 and the display layer 200, for example, the substrate 100 and the thin film transistor TFT. The phase shift layer PSL may include a through hole PSL-H through which light emitted from the electronic component 20 or directed towards the electronic component 20 may pass. The through hole PSL-H of the phase shift layer PSL is located in the transmittance area TA. The light passing through the phase shift layer PSL may have a phase that is shifted 180 degrees and may destructively interfere with light passing through neighboring portions of the phase shift layer PSL. Therefore, light distortion, which is diffracted around edges of the phase shift layer PSL and incident to the electronic component 20, may not occur or may be reduced.

Also, referring to FIG. 2B, a light-blocking layer BML may be on the phase shift layer PSL, for example, between the phase shift layer PSL and the thin film transistor TFT. The light-blocking layer BML may include a through hole BML-H through which the light emitted from the electronic component 20 or directed thereto may pass. The through hole BML-H of the light-blocking layer BML is located in the transmittance area TA. A portion of the light-blocking layer BML, where the through hole BML-H is not formed, may prevent or reduce diffraction of light through the pixel circuit in the second display area DA2 or narrow gaps between lines coupled to the pixel circuit, and the performance of the thin film transistor TFT may be improved.

The display layer 200 may be sealed by an encapsulation member. In some embodiments, as shown in FIGS. 2A and 2B, the encapsulation member may include the thin film encapsulation layer 300. The thin film encapsulation layer 300 may include at least one inorganic encapsulation layer and at least one organic encapsulation layer. In an embodiment, the thin film encapsulation layer 300 may include a first inorganic encapsulation layer 310, a second inorganic encapsulation layer 330, and an organic encapsulation layer 320 therebetween.

In the second display area DA2, one electronic component 20 or multiple electronic components 20 may be located. When the electronic apparatus 1 includes multiple electronic components 20, the electronic apparatus 1 may include the second display areas DA2 of which the number corresponds to the number of electronic components 20. For example, the electronic apparatus 1 may include the second display areas DA2 that are spaced apart from each other. In some embodiments, the electronic components 20 may be in one display area DA2. For example, the electronic apparatus 1 may include the second display area DA2 of a bar type (e.g., bar kind), and along a lengthwise direction of the second display area DA2, the electronic components 20 may be spaced apart from each other.

As shown in FIGS. 2A and 2B, the display panel 10 includes the organic light-emitting diode OLED as the display element, but the display panel 10 is not limited thereto. In another embodiment, the display panel 10 may be an inorganic light-emitting display (or an inorganic EL display) apparatus including an inorganic material such as a micro light-emitting diode (LED) or a quantum dot light-emitting display apparatus. For example, an emission layer of the display element included in the display panel 10 may include an organic material, an inorganic material, quantum dots, an organic material and quantum dots, or an inorganic material and quantum dots.

Figure 3:
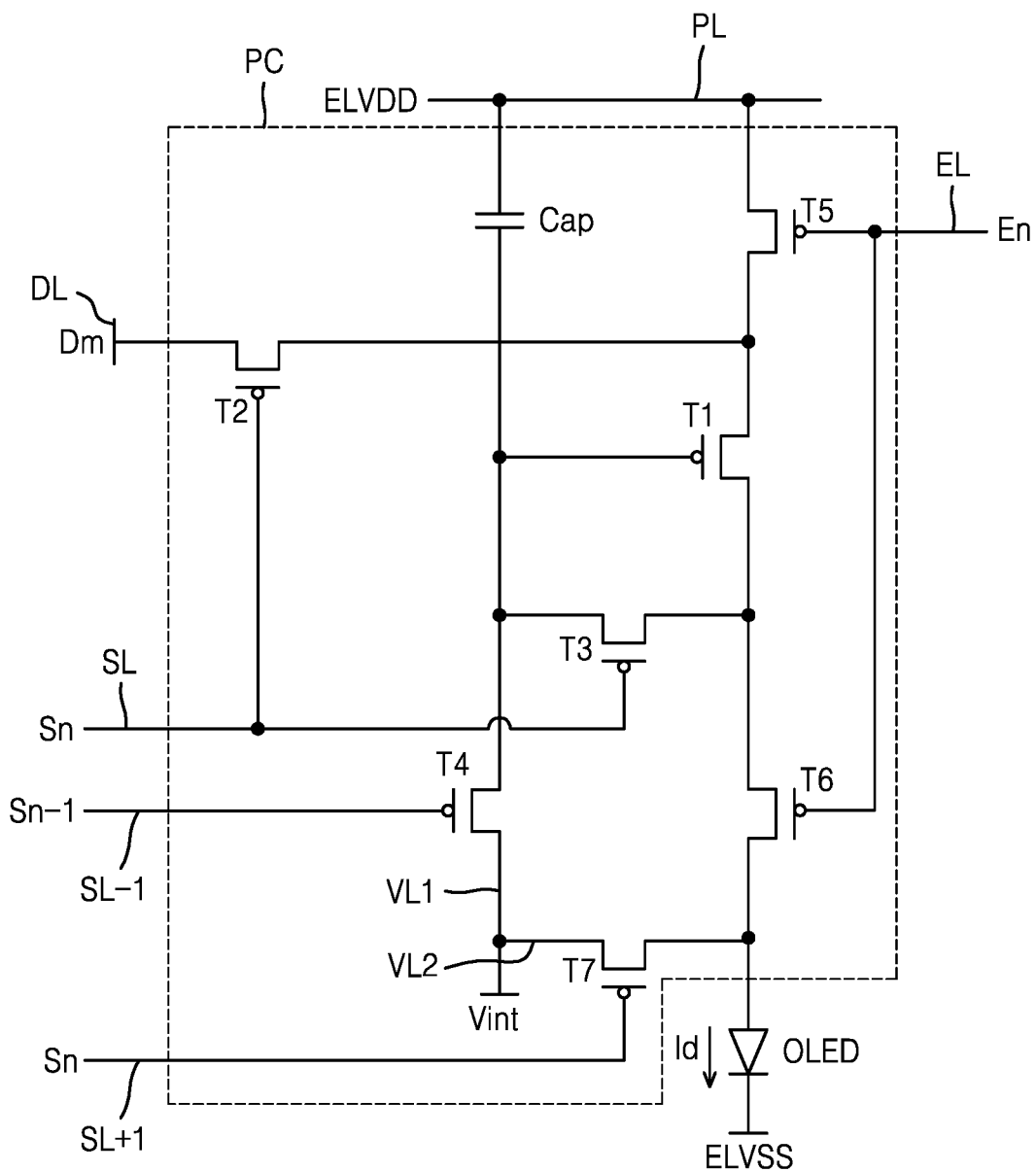
FIG. 3 is an equivalent circuit diagram showing a pixel circuit coupled to an organic light-emitting diode of the display panel, according to an embodiment.

FIG. 3 is an equivalent circuit diagram showing a pixel circuit coupled to an organic light-emitting diode of the display panel, according to an embodiment.

Referring to FIG. 3, the display panel 10 includes a pixel circuit PC including thin film transistors T1 to T7 and a storage capacitor Cap. The display panel 10 may include, as an emission element, the organic light-emitting diode OLED that emits light according to a driving voltage transmitted through the pixel circuit PC.

The pixel circuit PC may include the thin film transistors and the storage capacitor. According to an embodiment, as shown in FIG. 3, the thin film transistors may include a driving thin film transistor T1, a switching thin film transistor T2, a compensation thin film transistor T3, a first initialization thin film transistor T4, a driving control thin film transistor T5, an emission control thin film transistor T6, and a second initialization thin film transistor T7.

A gate electrode of the driving thin film transistor T1 may be coupled to an electrode of the storage capacitor Cap, one of a source electrode and a drain electrode of the driving thin film transistor T1 may be coupled to a driving voltage line PL via the driving control thin film transistor T5, and the other of the source electrode and the drain electrode of the driving thin film transistor T1 may be electrically coupled to a pixel electrode of the organic light-emitting diode OLED via the emission control thin film transistor T6. The driving thin film transistor T1 may provide a driving current Id to the organic light-emitting diode OLED in response to a data signal Dm, according to a switching operation of the switching thin film transistor T2.

A gate electrode of the switching thin film transistor T2 is coupled to a first scan line SL, one of a source electrode and a drain electrode of the switching thin film transistor T2 is coupled to a data line DL, and the other of the source electrode and the drain electrode of the switching thin film transistor T2 is coupled to the driving thin film transistor T1 and to the driving voltage line PL via the driving control thin film transistor T5. The switching thin film transistor T2 is turned on in response to a scan signal Sn transmitted through the first scan line SL, and performs a switching operation of transmitting the data signal Dm, which is transmitted to the data line DL, to the driving thin film transistor T1.

A gate electrode of the compensation thin film transistor T3 is coupled to the first scan line SL, one of a source electrode and a drain electrode of the compensation thin film transistor T3 is coupled to the driving thin film transistor T1 and to the pixel electrode of the organic light-emitting diode OLED via the emission control thin film transistor T6, and the other of the source electrode and the drain electrode of the compensation thin film transistor T3 is coupled to an electrode of the storage capacitor Cap, the first initialization thin film transistor T4, and the driving thin film transistor T1. The compensation thin film transistor T3 is turned on in response to the scan signal Sn transmitted through the first scan line SL and is diode-coupled to the driving thin film transistor T1 by being electrically coupled to one of the source electrode and the drain electrode (e.g., the drain electrode) of the driving thin film transistor T1.

A gate electrode of the first initialization thin film transistor T4 is coupled to a second scan line SL−1, one of a source electrode and a drain electrode of the first initialization thin film transistor T4 is coupled to the first initialization voltage line VL−1, and the other of the source electrode and the drain electrode of the first initialization thin film transistor T4 is coupled to the electrode of the storage capacitor Cap, the compensation thin film transistor T3, and the driving thin film transistor T1. The first initialization thin film transistor T4 is turned on in response to a previous scan signal Sn−1 transmitted through the second scan line SL−1 and performs an initialization operation of initializing a voltage of the gate electrode of the driving thin film transistor T1 by transmitting an initialization voltage Vint to the gate electrode of the driving thin film transistor T1.

A gate electrode of the driving control thin film transistor T5 is coupled to an emission control line EL, one of a source electrode and a drain electrode of the driving control thin film transistor T5 is coupled to the driving voltage line PL, and the other of the source electrode and the drain electrode of the driving control thin film transistor T5 is coupled to the driving thin film transistor T1 and the switching thin film transistor T2.

A gate electrode of an emission control thin film transistor T6 is coupled to the emission control line EL, one of a source electrode and a drain electrode of the emission control thin film transistor T6 is coupled to the driving thin film transistor T1 and a compensation source electrode S3 of the compensation thin film transistor T3, and the other of the source electrode and the drain electrode of the emission control thin film transistor T6 is electrically coupled to the pixel electrode of the organic light-emitting diode OLED and the second initialization thin film transistor T7.

The driving control thin film transistor T5 and the emission control thin film transistor T6 are concurrently (e.g., simultaneously) turned on in response to the emission control signal En transmitted through the emission control line EL, and the driving voltage ELVDD is transmitted to the organic light-emitting diode OLED, thereby allowing a driving current Id to flow in the organic light-emitting diode OLED.

A gate electrode of the second initialization thin film transistor T7 may be coupled to a third scan line SL+1 of a pixel in a subsequent line of the corresponding pixel P. Also, one of a source electrode and a drain electrode of the second initialization thin film transistor T7 is coupled to the emission control thin film transistor T6 and the pixel electrode of the organic light-emitting diode OLED, and the other of the source electrode and the drain electrode of the second initialization thin film transistor T7 is coupled to a second initialization voltage line VL2.

Because the first scan line SL and the third scan line SL+1 are electrically coupled to each other, the same scan line Sn may be transmitted thereto. Therefore, the second initialization thin film transistor T7 may be turned on in response to the scan signal Sn transmitted through the third scan line SL+1 and may perform an operation of initializing the pixel electrode of the organic light-emitting diode OLED.

In another embodiment, both the first initialization thin film transistor T4 and the second initialization thin film transistor T7 may be coupled to the second scan line SL−1.

One electrode of the storage capacitor Cap is coupled to the driving voltage line PL, and an opposite electrode of the organic light-emitting diode OLED is coupled to a common voltage ELVSS. Accordingly, the organic light-emitting diode OLED may display an image by emitting light according to the driving current Id transmitted from the driving thin film transistor T1.

Referring to FIG. 3, the pixel circuit PC includes seven thin film transistors T1 to T7 and one storage capacitor Cap. However, one or more embodiments are not limited thereto. The number of thin film transistors and the number of storage capacitors may vary according to a design of the pixel circuit PC.

Figure 4:
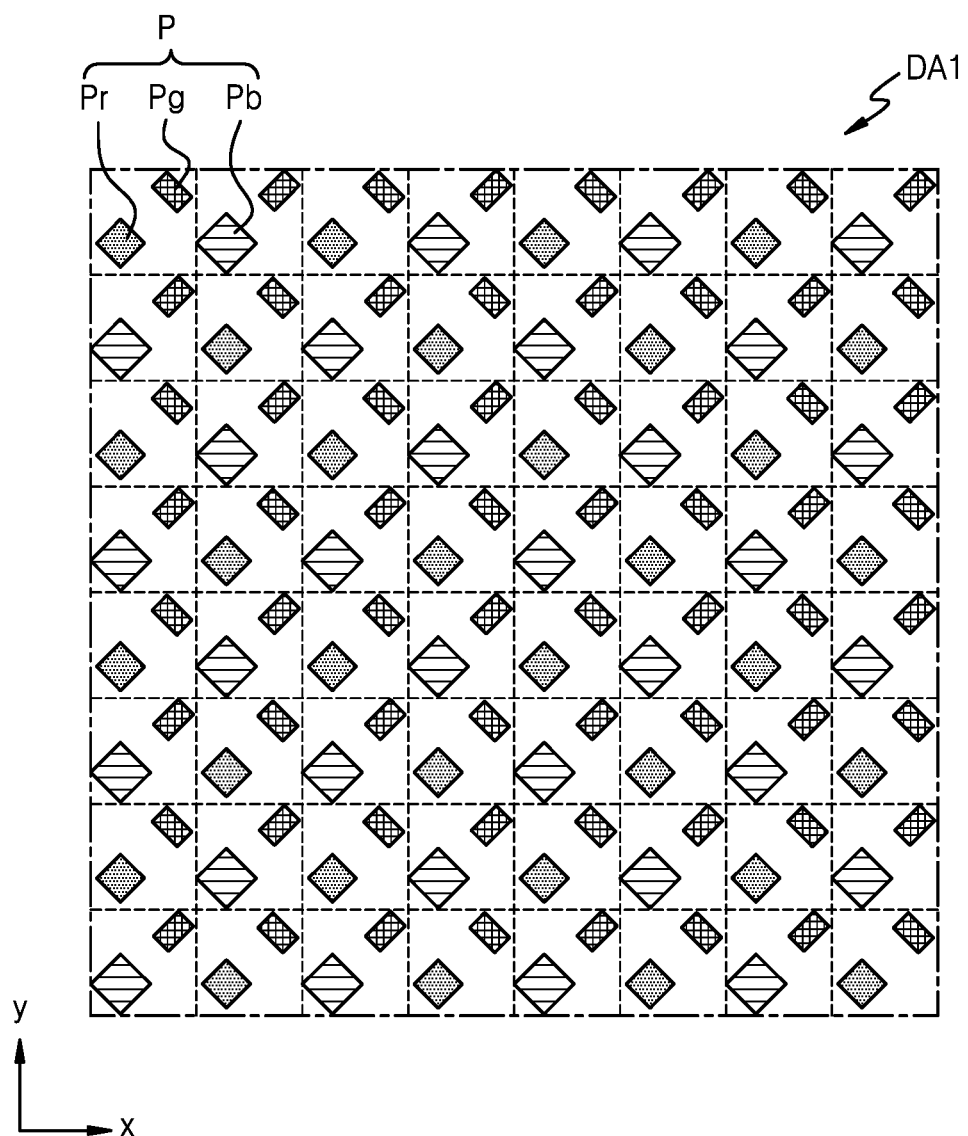
FIG. 4 is a schematic plan view of a portion of a first display area of the display panel, according to an embodiment.

FIG. 4 is a schematic plan view of a portion of the first display area of the display panel, according to an embodiment.

Referring to FIG. 4, the pixels P are arranged in the first display area DA1. The pixels P may include red pixels Pr, green pixels Pg, and/or blue pixels Pb. In some embodiments, as shown in FIG. 4, the red pixels Pr, the green pixels Pg, and the blue pixels Pb may be arranged in a pen-tile matrix. In other embodiments, the red pixel Pr, the green pixel Pg, and the blue pixel Pb may be arranged in stripes.

The red pixel Pr, the green pixel Pg, and the blue pixel Pb may have different sizes (or widths). For example, the size or width of the blue pixel Pb may be greater than those of the red pixel Pr and the green pixel Pg, and the size or width of the red pixel Pr may be greater than that of the green pixel Pg. In some embodiments, a shape of the green pixel Pg may be a rectangle, and adjacent green pixels Pg may extend in different directions, but the present disclosure is not limited thereto.

Figure 5:
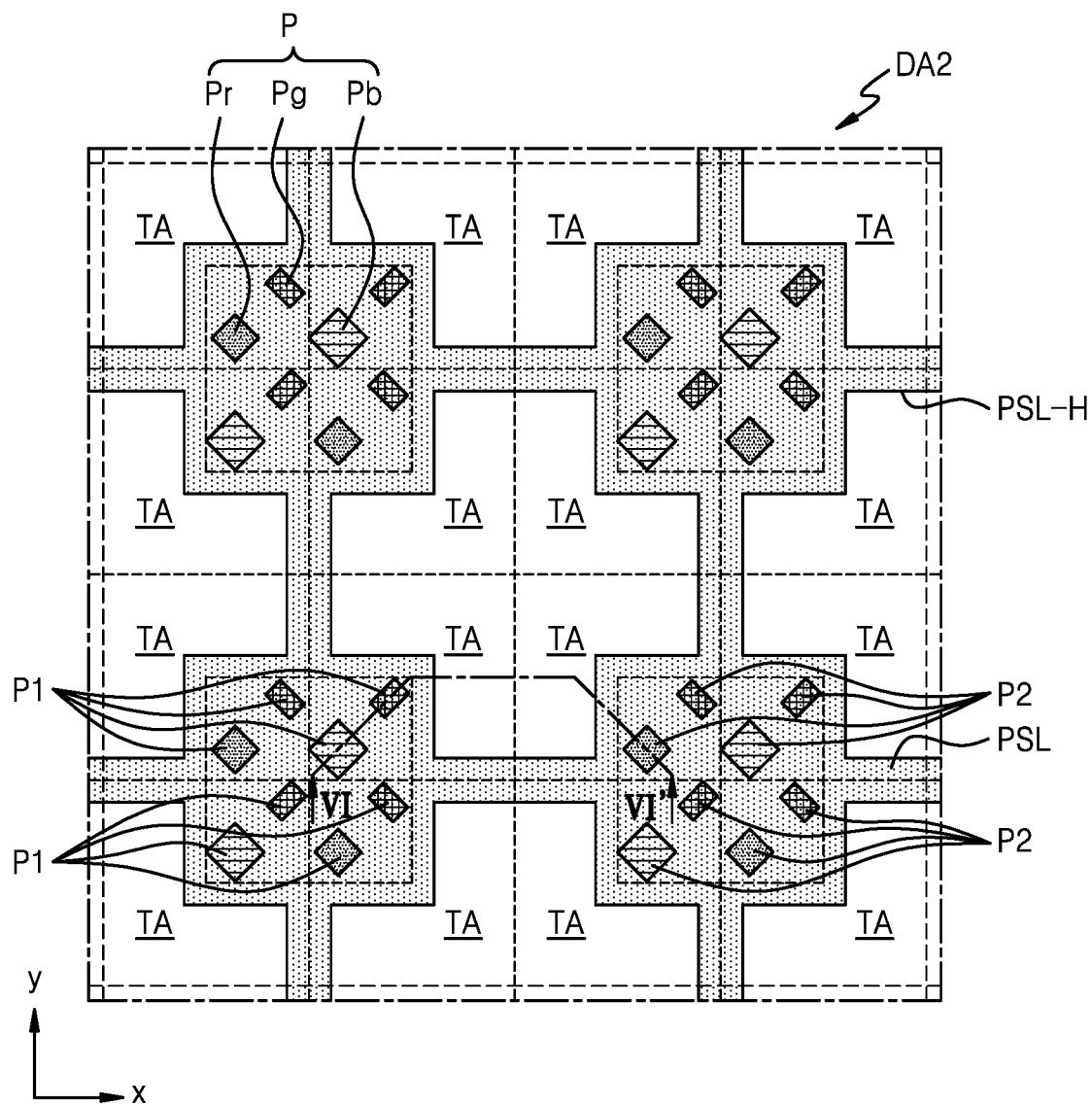
FIG. 5 is a schematic plan view of a portion of a second display area of the display panel, according to an embodiment.

FIG. 5 is a schematic plan view of a portion of the second display area of the display panel, according to an embodiment.

Referring to FIG. 5, the pixels P may be arranged in the second display area DA2. The pixels P may include red pixels Pr, green pixels Pg, and/or blue pixels Pb. In some embodiments, the red pixels Pr, the green pixels Pg, and the blue pixels Pb may be arranged in a pen-tile matrix. In other embodiments, the red pixel Pr, the green pixel Pg, and the blue pixel Pb may be arranged in stripes. A structure of each of the red pixel Pr, the green pixel Pg, and the blue pixel Pb may correspond to a cross-sectional structure described below with reference to FIG. 6.

The second display area DA2 may include the transmittance area TA. In the second display area DA2, the transmittance area TA may be adjacent to the pixels P. For example, the transmittance area TA may be between the pixels P. The pixels P arranged in the second display area DA2 may include first pixels P1 and the second pixels P, which are separate from each other with the transmittance area TA therebetween For explanation, FIG. 5 shows that two groups of pixels P, which are arranged in an x direction at the bottom, respectively are the first pixels P1 and the second pixels P2. However, two groups of pixels P, which are arranged in the x direction at the top, may be referred to as the first pixels P and the second pixels P2, and two groups of pixels P, which are arranged in a y direction with the transmittance area TA therebetween, may be referred to as the first pixels P and the second pixels P2.

The phase shift layer PSL may be in the second display area DA2 and may entirely overlap an area where the pixels P are arranged. The phase shift layer PSL may include the through hole PSL-H corresponding to the transmittance area TA. In some embodiments, the through hole PSL-H may roughly have a cross-shape on a plane as shown in FIG. 5, but the present disclosure is not limited thereto. For example, in other embodiments, the shape of the through hole PSL-H may be a circle, an oval, or a polygon such as a rectangle.

Figure 6:
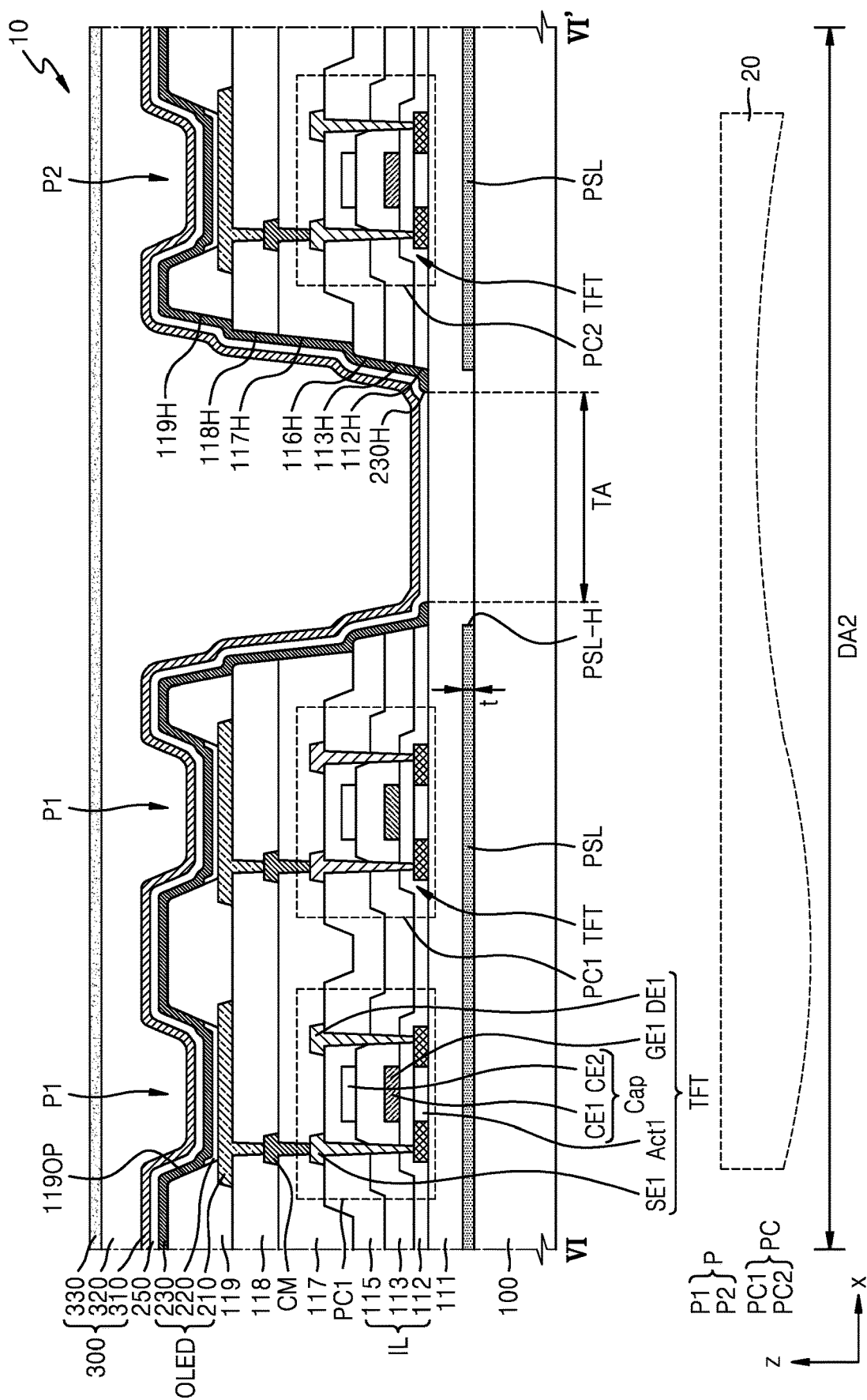
FIG. 6 is a schematic cross-sectional view of a portion of the display panel, according to an embodiment.

FIG. 6 is a schematic cross-sectional view of a portion of the display panel, according to an embodiment. The cross-sectional view of FIG. 6 corresponds to the cross-section taken along a line VI-VI' of FIG. 5.

Referring to FIG. 6, the substrate 100 may include a transparent insulating substrate including a material such as glass and/or quartz and may have a single-layer structure. In other embodiments, the substrate 100 may have a multilayered structure including a base layer and an inorganic layer that include a polymer resin.

A buffer layer 111 may be on the substrate 100. The buffer layer 111 may decrease or block the penetration of foreign materials, moisture, and/or external air from the bottom of the substrate 100 and may provide a flat surface on the substrate 100. The buffer layer 111 may include an inorganic insulating material such as silicon oxide ($SiO_2$), silicon oxynitride (SiON) and/or silicon nitride ($SiN_x$), and may have a single-layer structure or a multilayered structure including the above material(s).

On the buffer layer 111, a first pixel circuit PC1 and a second pixel circuit PC2 may be located. Each of the first pixel circuit PC1 and the second pixel circuit PC2 may correspond to the pixel circuit PC described with reference to FIG. 3. The first pixel circuit PC1 and the second pixel circuit PC2 may each include the thin film transistor TFT and the storage capacitor Cap and may have the same (e.g., substantially the same) structure.

The phase shift layer PSL may be between the substrate 100 and the first pixel circuit PC1 and the second pixel circuit PC2 in the second display area DA2. As shown in FIG. 6, the phase shift layer PSL may be between the substrate 100 and the buffer layer 111. However, the phase shift layer PSL may be between sub-substrate layers forming the substrate 100. For example, the substrate 100 may have a stack structure in which a first base layer including polymer, a first inorganic layer including an inorganic insulating material, a second base layer including polymer, and a second inorganic layer including an inorganic insulating material are sequentially stacked, and the phase shift layer PSL may be between the aforementioned layers. In other embodiments, the phase shift layer PSL may be between sub-buffer layers forming the buffer layer 111. One phase shift layer PSL or at least two phase shift layers PSL may be in the second display area DA2.

Of light passing through the phase shift layer PSL, light in a set or certain wavelength band may have a phase that is shifted 180 degrees. For example, the phase shift layer PSL may invert, 180 degrees, a phase of light in a red light band (peak wavelengths are equal to or greater than 580 nm and less than 750 nm), a green light band (peak wavelengths are equal to or greater than 495 nm or less than 580 nm), or a blue light band (peak wavelengths are equal to or greater than 400 nm or less than 495 nm) of light in a visible light band. Hereinafter, the expression 'certain wavelength band', 'first wavelength band', or 'second wavelength band' may indicate one of a red light band, a green light band, and a blue light band.

The phase shift layer PSL may have a set or certain light transmittance. For example, the light transmittance of the phase shift layer PSL may be between about 3% and about 80%, about 5% and about 80%, about 10% and about 80%, about 20% and about 80%, about 30% and about 80%, about 40% and about 80%, or about 50% and about 80%. Also, the light transmittance of the phase shift layer PSL may be between about 5% and about 50%, about 10% and about 50%, about 20% and about 50%, or about 30% and about 50%.

The phase shift layer PSL may include at least one selected from the group consisting of transition metals, silicon compounds, transition metal oxides, transition metal nitrides, transition metal oxynitrides, transition metal carbides, and transition metal oxynitride carbides. In an embodiment, the phase shift layer PSL may include just a transition metal or may include a transition metal and a silicon compound. In other embodiments, the phase shift layer PSL may include a transition metal and at least one selected from the group consisting of transition metal oxides, transition metal nitrides, transition metal oxynitrides, transition metal carbides, and transition metal oxynitride carbides. In other embodiments, the phase shift layer PSL may include a transition metal, a silicon compound, and at least one selected from the group consisting of transition metal oxides, transition metal nitrides, transition metal oxynitrides, transition metal carbides, and transition metal oxynitride carbides.

The phase shift layer PSL may have a set or certain thickness t. For example, the thickness t may be between about 1000 Å and about 3000 Å, about 1500 Å and about 3000 Å, or about 2000 Å and about 3000 Å. In some embodiments, the thickness t of the phase shift layer PSL may be less than or equal to 1000 Å or equal to or greater than 3000 Å.

The phase shift layer PSL may have a set or certain refractive index. For example, the refractive index of the phase shift layer PSL may be between about 1.5 and about 4, about 2 and about 4, about 2.5 and about 4, or about 3 and about 4. In some embodiments, the refractive index may be between about 1.5 and about 3.5, about 1.5 and about 3, about 1.5 and about 2.5, or about 1.5 and about 2. In some embodiments, the refractive index may be between about 1.0 and about 1.5 or may be equal to or greater than 4.

The phase shift layer PSL may have a set or certain extinction coefficient. For example, the extinction coefficient may be between about 0.01 and about 2, about 0.1 and about 2, about 0.5 and about 2, or about 1 and about 2. For example, the extinction coefficient may be between about 0.01 and about 1, about 0.01 and about 0.5, or about 0.01 and about 0.1.

A wavelength band, in which the phase shift layer PSL inverts a phase of transmitted light 180 degrees, may depend on the thickness t, the refractive index, the material, and the composition ratio of the phase shift layer PSL.

The thin film transistor TFT may include a semiconductor layer Act1, a gate electrode GE1 overlapping a channel area of the semiconductor layer Act1, and a source electrode SE1 and a drain electrode DE1 respectively coupled to a source area and a drain electrode of the semiconductor layer Act1. A first gate insulating layer 112 may be between the semiconductor layer Act1 and the gate electrode GE1, and a second gate insulating layer 113 and an interlayer insulating layer 115 may be between the gate electrode GE1 and the source electrode SE1 or between the gate electrode GE1 and the drain electrode DE1.

The storage capacitor Cap may overlap the thin film transistor TFT. The storage capacitor Cap may include a first charging plate CE1 and a second charging plate CE2 that overlap each other. In some embodiments, the gate electrode GE1 of the thin film transistor TFT may include the first charging plate CE1 of the storage capacitor Cap. The second gate insulating layer 113 may be between the first charging plate CE1 and the second charging plate CE2.

The semiconductor layer Act1 may include polysilicon. In some embodiments, the semiconductor layer Act1 may include amorphous silicon. In some embodiments, the semiconductor layer Act1 may include at least one oxide selected from the group consisting of indium (In), gallium (Ga), tin or stannum (Sn), zirconium (Zr), vanadium (V), hafnium (Hf), cadmium (Cd), germanium (Ge), chromium (Cr), titanium (Ti), and zinc (Zn). The semiconductor layer Act1 may include the source and drain areas doped with impurities and a channel area.

The first gate insulating layer 112 may include an inorganic insulating material including $SiO_2$, SiON, and/or $SiN_x$, and may have a single-layer structure or a multilayered structure including the above material(s).

The gate electrode GE1 or the first charging plate CE1 may include a low-resistance conductive material such as Mo, Al, Cu, and/or Ti, and may have a single-layer structure or a multilayered structure including the above material(s).

The second gate insulating layer 113 may include an inorganic insulating material such as $SiO_2$, SiON, and/or $SiN_x$, and may have a single-layer structure or a multilayered structure including the above material(s).

The second charging plate CE2 may include Al, platinum (Pt), palladium (Pd), silver (Ag), magnesium (Mg), gold (Au), nickel (Ni), neodymium (Nd), iridium (Ir), Cr, lithium (Li), calcium (Ca), molybdenum (Mo), titanium (Ti), tungsten (W), and/or copper (Cu), and may have a single-layer structure or a multilayered structure including the above material(s).

The interlayer insulating layer 115 may include an inorganic insulating material such as $SiO_2$, SiON, and/or $SiN_x$, and may have a single-layer structure or a multilayered structure including the above material(s).

The source electrode SE1 or the drain electrode DE1 may each include Al, Pt, Pd, Ag, Mg, Au, Ni, Nd, Ir, Cr, Ni, Ca, Mo, Ti, W, and/or Cu, and may have a single-layer structure or a multilayered structure including the above material(s). For example, the source electrode SE1 or the drain electrode DE1 may have a tri-layer structure of Ti/Al/Ti.

The aforementioned pixel circuit PC including the thin film transistor TFT and the storage capacitor Cap may be electrically coupled to the pixel electrode 210. As shown in FIG. 5, the pixel circuit PC and the pixel electrode 210 may be electrically coupled to each other by contact metal CM.

The contact metal CM may be on a first planarization insulating layer 117 and may contact the pixel circuit PC through a contact hole formed in the first planarization insulating layer 117. The contact metal CM may include Al, Pt, Pd, Ag, Mg, Au, Ni, Nd, Ir, Cr, Ni, Ca, Mo, Ti, W, and/or Cu, and may have a single-layer structure or a multilayered structure including the above material(s).

The first planarization insulating layer 117 may include an organic insulating material. The first planarization insulating layer 117 may include acryl, benzocyclobutene (BCB), polyimide, and/or hexamethyldisiloxane (HMDSO). The organic insulating material of the first planarization insulating layer 117 may include a photosensitive organic insulating material.

A second planarization insulating layer 118 is on the contact metal CM. The second planarization insulating layer 118 may include an organic insulating material. The second planarization insulating layer 118 may include an organic insulating material such as acryl, BCB, polyimide, and/or HMDSO. The organic insulating material of the second planarization insulating layer 118 may be a photosensitive organic insulating material.

The pixel electrode 210 may be on the second planarization insulating layer 118. The pixel electrode 210 may contact (e.g., physically contact) the contact metal CM through a contact hole of the second planarization insulating material 118.

The pixel electrode 210 may include a reflective layer including Ag, Mg, Al, Pt, Pd, Au, Ni, Nd, Ir, Cr, and/or a compound thereof. The pixel electrode 210 may include the reflective layer including the above material, and a transparent conductive layer on and/or under the reflective layer. The transparent conductive layer may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the pixel electrode 210 may have a tri-layer structure in which an ITO layer, an Ag layer, and an ITO layer are sequentially stacked.

A pixel-defining layer 119 may be on the pixel electrode 210. The pixel-defining layer 119 may cover edges of the pixel electrode 210 and may include an opening 1190P overlapping the center of the pixel electrode 210.

The pixel-defining layer 119 may prevent or reduce the generation of arcs, etc. at the edges of the pixel electrode 210 by increasing a distance between the edges of the pixel electrode 210 and the opposite electrode 230 above the pixel electrode 210. The pixel-defining layer 119 may include an organic insulating material such as polyimide, polyamide, acryl resin, BCB, HMDSO, and/or phenol resin and may be formed by using a spin coating method, etc.

On the pixel-defining layer 119, an intermediate layer 220 is formed corresponding to the pixel electrode 210. The intermediate layer 220 may include a polymer organic material and/or a low-molecular weight material emitting light of a set or certain color.

The opposite electrode 230 is on the intermediate layer 220. The opposite electrode 230 may include a conductive material having a relatively low work function. For example, the opposite electrode 230 may include a transparent (translucent) layer including Ag, Mg, Al, Ni, Cr, Li, Ca, and/or an alloy thereof. In some embodiments, the opposite electrode 230 may further include, on the transparent (translucent) layer including the aforementioned material(s), a layer such as ITO, IZO, ZnO, and/or $In_2O_3$. In an embodiment, the opposite electrode 230 may include Ag and/or Mg. The opposite electrode 230 may be integrally formed to entirely cover the first and second display areas (DA1 and DA2 of FIG. 1).

The stack structure, in which the pixel electrode 210, the intermediate layer 220, and the opposite electrode 230 are sequentially stacked, may form a light-emitting diode, for example, the organic light-emitting diode OLED. The organic light-emitting diode OLED may emit red light, green light, and/or blue light, and each emission area of the organic light-emitting diode OLED corresponds to the pixel P. Because the opening 1190P of the pixel-defining layer 119 defines a size and/or a width of the emission area, a size and/or a width of the pixel P may depend on a size and/or a width of the opening 1190P of the pixel-defining layer 119 corresponding to the pixel P.

On the opposite electrode 230, a capping layer 250 may be formed. The capping layer 250 may include LiF. In some embodiments, the capping layer 250 may include an inorganic insulating material such as $SiN_x$ and/or an organic insulating material. In some embodiments the capping layer 250 may not be formed.

A thin film encapsulation layer 300 may be on the capping layer 250. The organic light-emitting diode OLED may be covered by the thin film encapsulation layer 300. The thin film encapsulation layer 300 may include the first and second inorganic encapsulation layers 310 and 330 and the organic encapsulation layer 320 therebetween.

Each of the first and second inorganic encapsulation layers 310 and 330 may include at least one inorganic insulating material. The inorganic insulating material may include aluminum oxide ($Al_2O_3$), titanium oxide ($TiO_2$), tantalum oxide ($Ta_2O_5$), hafnium oxide ($HfO_2$), zinc oxide ($ZnO_2$), silicon oxide ($SiO_2$), silicon nitride ($SiN_x$), and/or silicon oxynitride (SiON). The first and second inorganic encapsulation layers 310 and 330 may be formed by using a chemical vapor deposition method.

The organic encapsulation layer 320 may include a polymer-based material. The polymer-based material may include acryl-based resin, epoxy-based resin, polyimide, and/or polyethylene. For example, the organic encapsulation layer 320 may include acryl-based resin, for example, polymethyl methacrylate, polyacrylic acid, and/or the like. The organic encapsulation layer 320 may be formed by hardening a monomer or spreading a polymer.

Each of insulating layers on the substrate 100 may include a hole formed in the transmittance area TA. For example, the first gate insulating layer 112, the second gate insulating layer 113, the interlayer insulating layer 115, the first planarization insulating layer 117, the second planarization insulating layer 119, and the pixel-defining layer 119 may respectively include first to sixth holes 112H, 113H, 116H, 117H, 118H, and 119H located in the transmittance area TA and overlapping each other. Also, the opposite electrode 230 may include a hole 230H formed in the transmittance area TA. The phase shift layer PSL is not in the transmittance area TA. For example, the phase shift layer PSL may include the through hole PSL-H corresponding to the transmittance area TA. Thus, the light transmittance of the transmittance area TA may be improved.

In an embodiment, the display panel 10 may include the first pixel circuits PC1 and the second pixel circuits PC2 on the substrate, spaced apart from each other with the transmittance area TA therebetween, and each including a thin film transistor and a storage capacitor. Also, the display panel 10 may include first display elements electrically coupled to the first pixel circuits PC1, respectively, and the second display elements electrically coupled to the second pixel circuits PC2, respectively, and may also include the phase shift layer PSL between the substrate 100 and the first and second pixel circuits PC1 and PC2. For convenience, FIG. 6 shows a single second pixel circuit PC2 and a single second display element.

Figure 7:
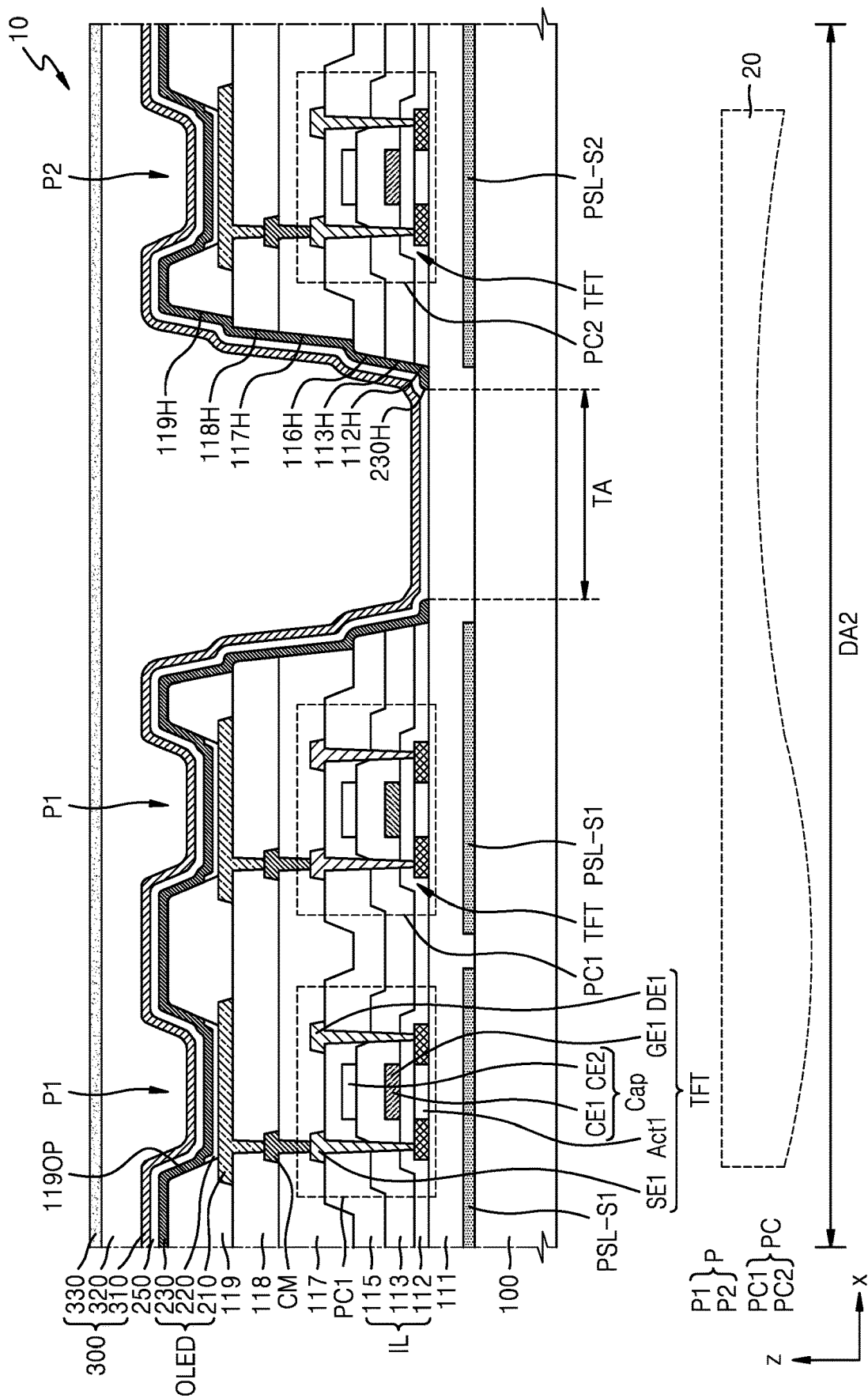
FIG. 7 is a schematic cross-sectional view of a portion of the display panel, according to another embodiment.

FIG. 7 is a schematic cross-sectional view of a portion of the display panel, according to another embodiment. A structure of the display panel according to the present embodiment is the same (e.g., substantially the same) as the structure described with reference to FIG. 6, and hereinafter a difference therebetween will be mainly described.

The phase shift layer PSL between the substrate 100 and the first and second pixel circuits PC1 and PC2 may include sub-phase shift layers. For example, the phase shift layer PSL may include first sub-phase shift layers PSL-S1 respectively overlapping the first pixel circuits PC1, and second sub-phase shift layers PSL-S2 respectively overlapping the second pixel circuits PC2. The first sub-phase shift layers PSL-S1 and the second sub-phase shift layers PSL-S2 may be spaced apart from each other and arranged in an isolated form.

Figure 8:
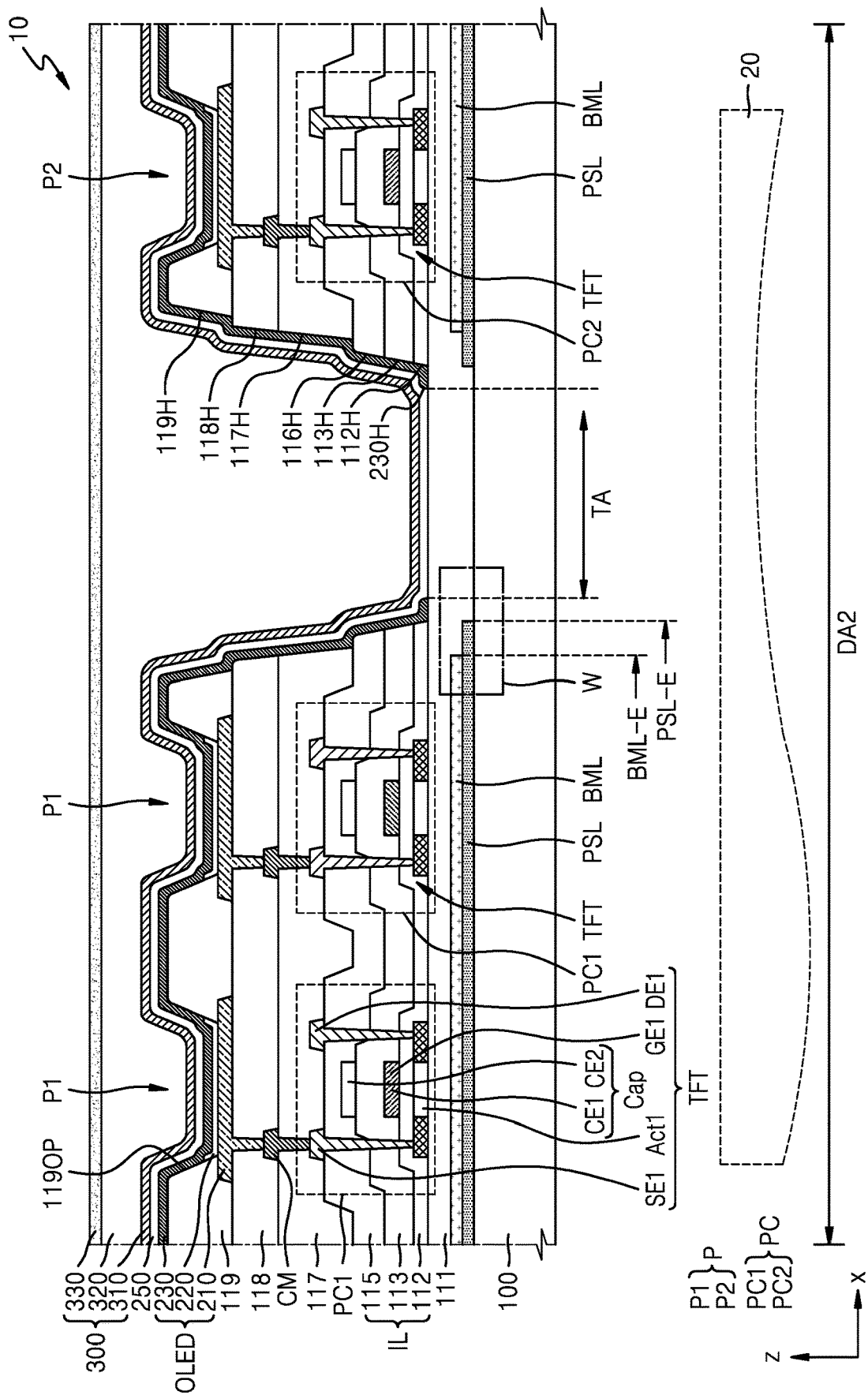
FIG. 8 is a schematic cross-sectional view of a portion of the display panel, according to another embodiment.

FIG. 8 is a schematic cross-sectional view of a portion of the display panel, according to another embodiment. The structure of the display panel 10 is the same (e.g., substantially the same) as that described with reference to FIG. 6, and hereinafter, a difference therebetween will be mainly described.

The light-blocking layer BML may be on the phase shift layer PSL. The light-blocking layer BML may include a light-blocking material. The light-blocking material may include, for example, metal such as Cr and/or Mo, a black ink, dye, and/or the like. The light transmittance of the light-blocking layer BML may be less than that of the phase shift layer PSL.

The light-blocking layer BML may prevent or reduce diffraction of the light, which is emitted from the electronic component 20 or directed thereto, through narrow gaps between lines coupled to the pixel circuit PC and prevent or reduce the incidence of the light emitted from the electronic component 20 from to the pixel circuit PC. Thus, the performance of the thin film transistor TFT may be improved.

In an embodiment, an edge PSL-E of the phase shift layer PSL may be closer to the transmittance area TA than an edge BML-E of the light-blocking layer BML, and the edge PSL-E and the edge BML-E may form a step difference. For example, the edge PSL-E of the phase shift layer PSL may be elongated further towards the transmittance area TA by about 0.3 μm to about 5 μm, compared to the edge BML-E of the light-blocking layer BML.

Figure 9:
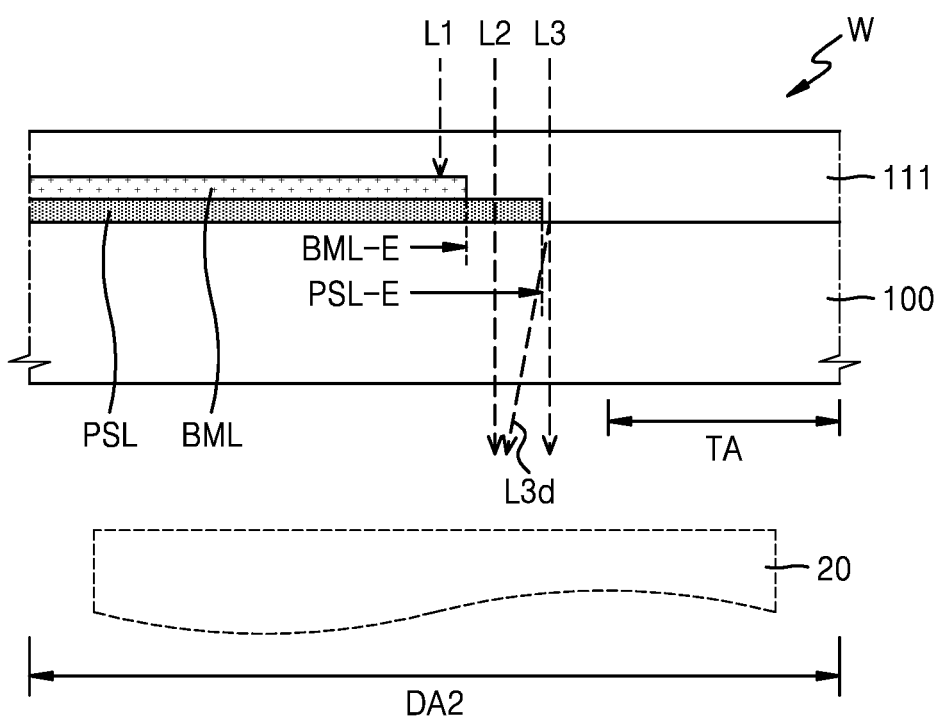
FIG. 9 is a schematic enlarged cross-sectional view of a portion of the display panel of FIG. 8.
Figure 10:
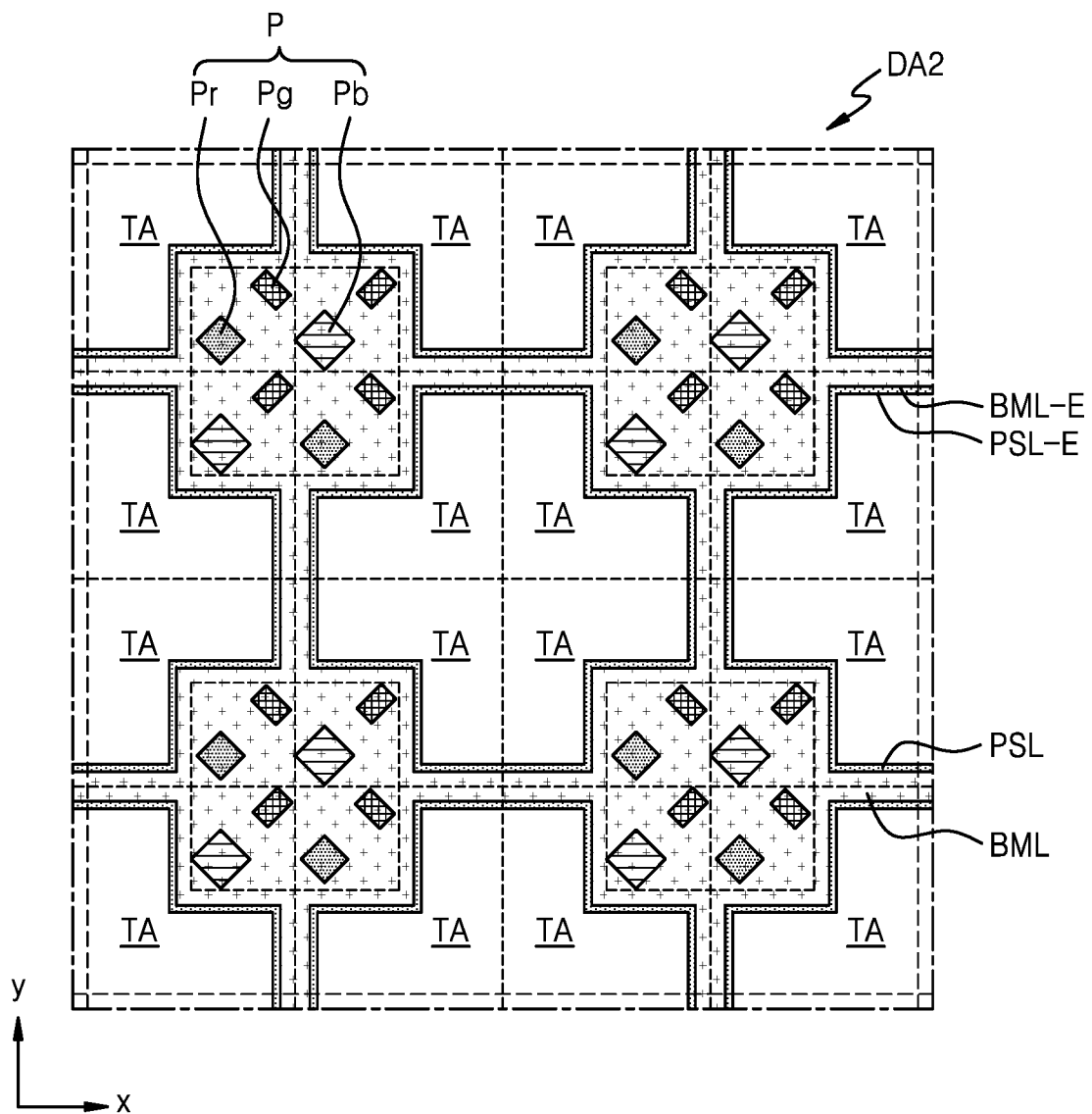
FIG. 10 is a schematic plan view of a portion of the second display area of the display panel, according to another embodiment.

FIG. 9 is a schematic enlarged cross-sectional view of a portion of the display panel of FIG. 8 and corresponds to an area W of FIG. 8. FIG. 10 is a schematic plan view of a portion of the second display area of the display panel, according to another embodiment and corresponds to the embodiment of FIG. 9.

Referring to FIG. 9, paths of light beams L1, L2, and L3 among light beams that are incident to the display panel are indicated by dashed arrows. Because the first light beam L1 that is incident to the light-blocking layer BML may not penetrate the light-blocking layer BML, the light beam may not be incident to the electronic component 20 due to the light-blocking layer BML. The second light beam L2, which is incident to an area of the phase shift layer PSL that does not overlap the light-blocking layer BML, may partially penetrate the light-blocking layer BML because the phase shift layer PSL has the set or certain light transmittance. However, the second light beam L2 may reach the electronic component 20 while the phase of the second light beam L2 is inverted 180 degrees in a set or certain wavelength band. The third light beam L3, which does not pass through the phase shift layer PSL in an area close to the edge PSL-E of the phase shift layer PSL, may reach the electronic component 20 by passing through the buffer layer 111 and the substrate 100.

Part of the third light beam L3 may be diffracted around the edge of the phase shift layer PSL, and diffracted light L3d may destructively interfere with the second light beam L2. The distortion (e.g., image distortion) by the diffracted light among the light received by the electronic component 20 may be removed or may decrease, and furthermore, high-quality images may be provided.

In an embodiment, light that is subject to the destructive interference may be green light. Among the cone cells of the retinal cells of the human eye, the green cone cells have the largest proportion after the red cone cells, and the rod cells absorb green light best in a dark environment, so the green light among the visible rays may have the highest visibility. Therefore, according to an embodiment, an effect of embodiments of the present disclosure may be improved by using the phase shift layer PSL for the phase inversion of the green light.

In another embodiment, light that is subject to the destructive interference may be red light. A diffraction amount of the red light may be the greatest because its peak wavelength is the longest. Therefore, according to an embodiment, the effect of embodiments of the disclosure may be improved by using the phase shift layer PSL for the phase inversion of the red light.

In another embodiment, light that is subject to the destructive interference may be blue light.

Referring to FIG. 10, the phase shift layer PSL and the light-blocking layer BML are on a plane. Because the edge PSL-E of the phase shift layer PSL is closer to the transmittance area TA than the edge BML-E of the light-blocking layer BML, an area where the phase shift layer PSL is located may be greater than an area where the light-blocking layer BML is located.

Figure 11:
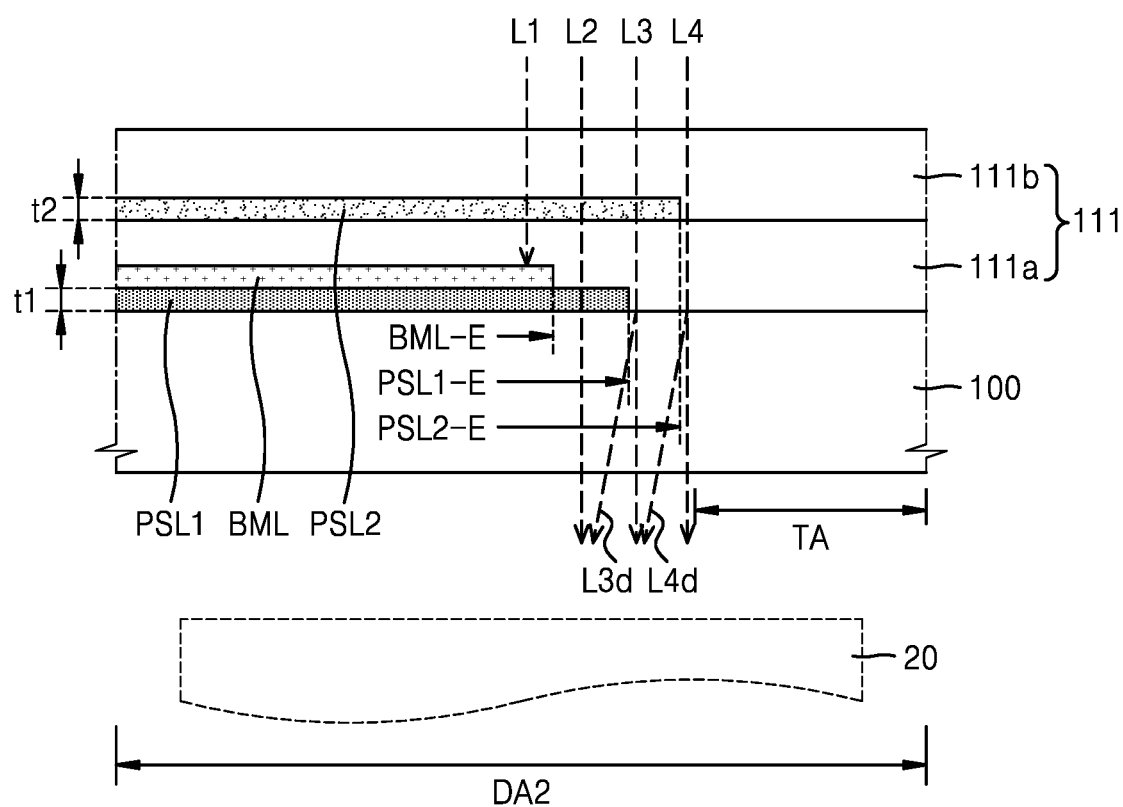
FIG. 11 is a schematic enlarged cross-sectional view of a portion of the display panel, according to another embodiment.
Figure 12:
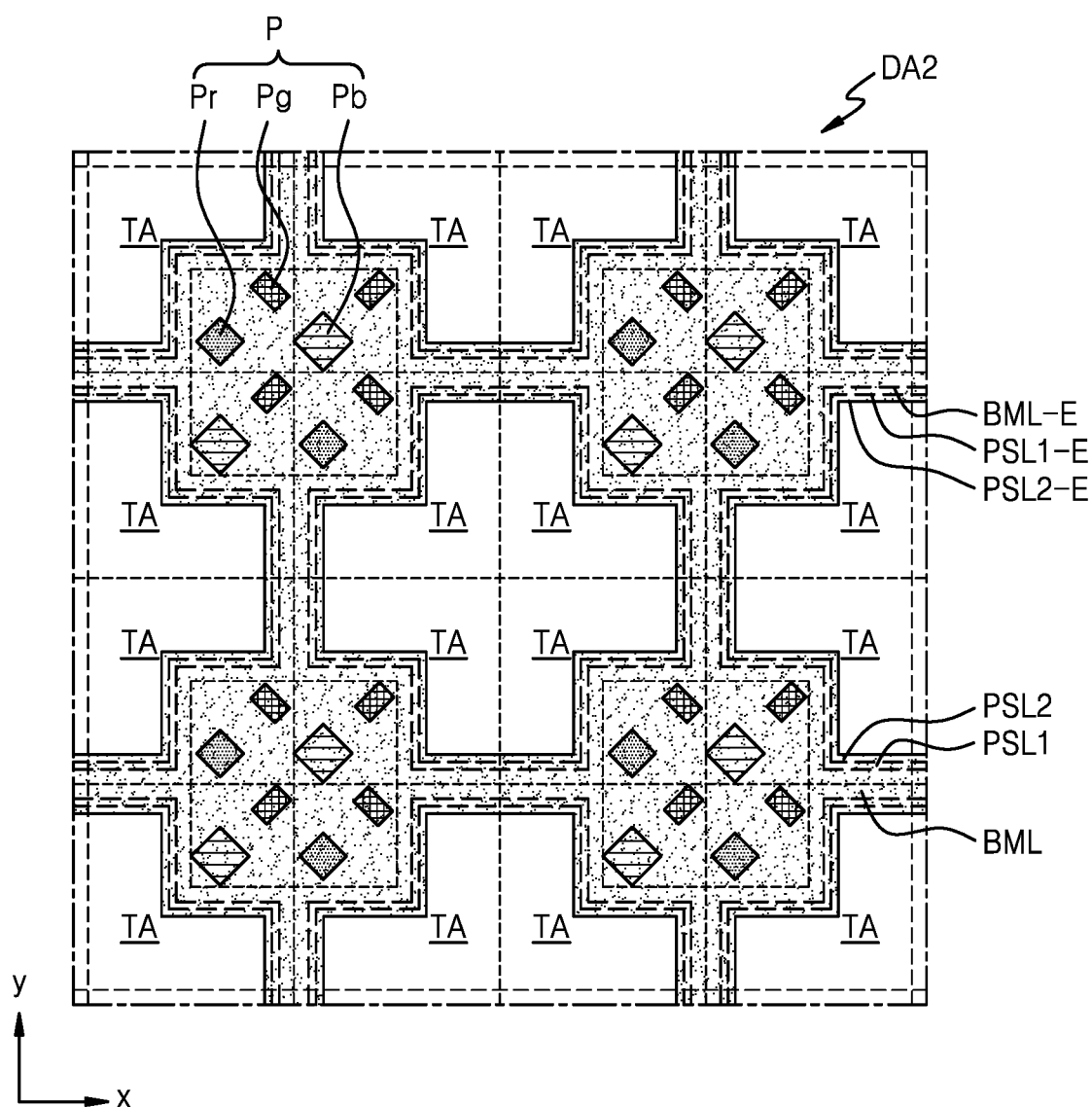
FIG. 12 is a schematic plan view of a portion of the second display area of the display panel, according to another embodiment.

FIG. 11 is a schematic enlarged cross-sectional view of a portion of the display panel, according to another embodiment, and FIG. 12 is a schematic plan view of a portion of the second display area of the display panel, according to another embodiment.

Referring to FIG. 11, a first phase shift layer PSL1 may be on the substrate 100, the light-blocking layer BML may be on the first phase shift layer PSL1, and a second phase shift layer PSL2 may be on the light-blocking layer BML. The second phase shift layer PSL2 may overlap the first phase shift layer PSL1 and the light-blocking layer BML.

In an embodiment, the buffer layer 111 may include sub-buffer layers, for example, a first sub-buffer layer 111a and a second sub-buffer layer 111b. The first sub-buffer layer 111a may be between the first phase shift layer PSL1 and the light-blocking layer BML and the second phase shift layer PSL2, and thus may cover the first phase shift layer PSL1 and the light-blocking layer BML. The second sub-buffer layer 111b may be on the second phase shift layer PSL2 and cover the same.

An edge PSL1-E of the first phase shift layer PSL1 may be closer to the transmittance area TA than the edge BML-E of the light-blocking layer BML. Also, an edge PSL2-E of the second phase shift layer PSL2 may be closer to the transmittance area TA than the edge PSL1-E of the first phase shift layer PSL1.

Each of the first phase shift layer PSL1 and the second phase shift layer PSL2 may shift a phase of light in the visible light band 180 degrees. The first phase shift layer PSL1 and the second phase shift layer PSL2 may respectively shift phases of light beams in different wavelength bands. For example, the first phase shift layer PSL1 may shift a phase of light in a first wavelength band 180 degrees, and the second phase shift layer PSL2 may shift a phase of light in a second wavelength band 180 degrees. Each of the light in the first wavelength band and the light in the second wavelength band may be one of light in red, green, and blue light band, but may have different peak wavelengths. The light transmittance of the first phase shift layer PSL1 may be different from that of the second phase shift layer PSL2. According to embodiments, the light transmittance of the first phase shift layer PSL1 may be greater than, equal to, or less than the light transmittance of the second phase shift layer PSL2.

The first phase shift layer PSL1 and the second phase shift layer PSL2 may respectively have a first thickness t1 and a second thickness t2 that are different from each other. According to embodiments, a thickness of the first phase shift layer PSL1 may be greater than, equal to, or less than a thickness of the second phase shift layer PSL2.

The first phase shift layer PSL1 and the second phase shift layer PSL2 may respectively have first and second refractive indices that are different from each other. The first refractive index may be greater than, equal to, or less than the second refractive index. The first phase shift layer PSL1 and the second phase shift layer PSL2 may each include at least one selected from the group consisting of transition metals, silicon compounds, transition metal oxides, transition metal nitrides, transition metal oxynitrides, transition metal carbides, and transition metal oxynitride carbides. A material and/or a composition ratio of the second phase shift layer PSL2 may differ from a material and/or a composition ratio of the first phase shift layer PSL1. A thickness, a refractive index, a material, and a composition of each of the first phase shift layer PSL1 and the second phase shift layer PSL2 may be determined by inverting a phase of light in a set or certain wavelength band 180 degrees.

Referring to FIG. 11, paths of light beams L1, L2, L3, and L4 among light beams that are incident to the display panel are indicated by dashed arrows. Because the first light beam L1, which is incident to the block-blocking layer BML, fails to penetrate the block-blocking layer BML, the light beam may not be incident to the electronic component 20 due to the light-blocking layer BML. The second light beam L2, which is in the visible light band and incident to an area of the first phase shift layer PSL1 that does not overlap the light-blocking layer BML, may pass through the first and second phase shift layers PSL1 and PSL2. A light beam in the first wavelength band of the second light beam L2 in the visible light band may have a phase that is shifted by the first phase shift layer PSL1 180 degrees, and a light beam in the second wavelength band may have a phase that is shifted by the second phase shift layer PSL2 180 degrees, thereby reaching the electronic component 20.

The light beam in the second wavelength band of the third light beam L3 in the visible light band, which is incident to an area close to the edge PLS1-E of the first phase shift layer PSL1, may have a phase that is inverted 180 degrees while passing through the second phase shift layer PSL2. Part of the third light beam L3 may be diffracted around the edge of the first phase shift layer PSL1. The diffracted light L3d may destructively interfere with a light beam of the second light beam L2, which is in the first wavelength band and of which the phase is inverted 180 degrees, and thus the distortion (e.g., image distortion) by the diffracted light of the light received by the electronic component 20 may be removed or may decrease.

Part of the fourth light beam L4, which is in the visible light band and incident to an area close to the edge PSL2-E of the second phase shift layer PSL2, may be diffracted around the edge of the second phase layer PSL2. Diffracted light L4d may destructively interfere with the light of the third light beam L3, which is in the second wavelength band and has a phase shifted 180 degrees, and thus the distortion (e.g., image distortion) by the diffracted light among the light received by the electronic component 20 may be removed or may decrease.

Referring to FIG. 12, the first and second phase shift layers PSL1 and PSL2 are on the plane. Because the edge PSL2-E of the second phase shift layer PSL2 is closer to the transmission area TA than the edge PSL1-E of the first phase shift layer PSL1 and the edge BML-E of the light-blocking layer BML, an area where the second phase shift layer PSL2 is located may be greater than an area where the first phase shift layer PSL1 and the light-blocking layer BML are located. Because the second phase shift layer PSL2 is at an uppermost layer from among the first and second phase shift layers PSL1 and PSL2 and the light-blocking layer BML, the edge PSL1-E of the first phase shift layer PSL1 and the edge BML-E of the light-blocking layer BML are indicated by dashed lines.

Figure 13:
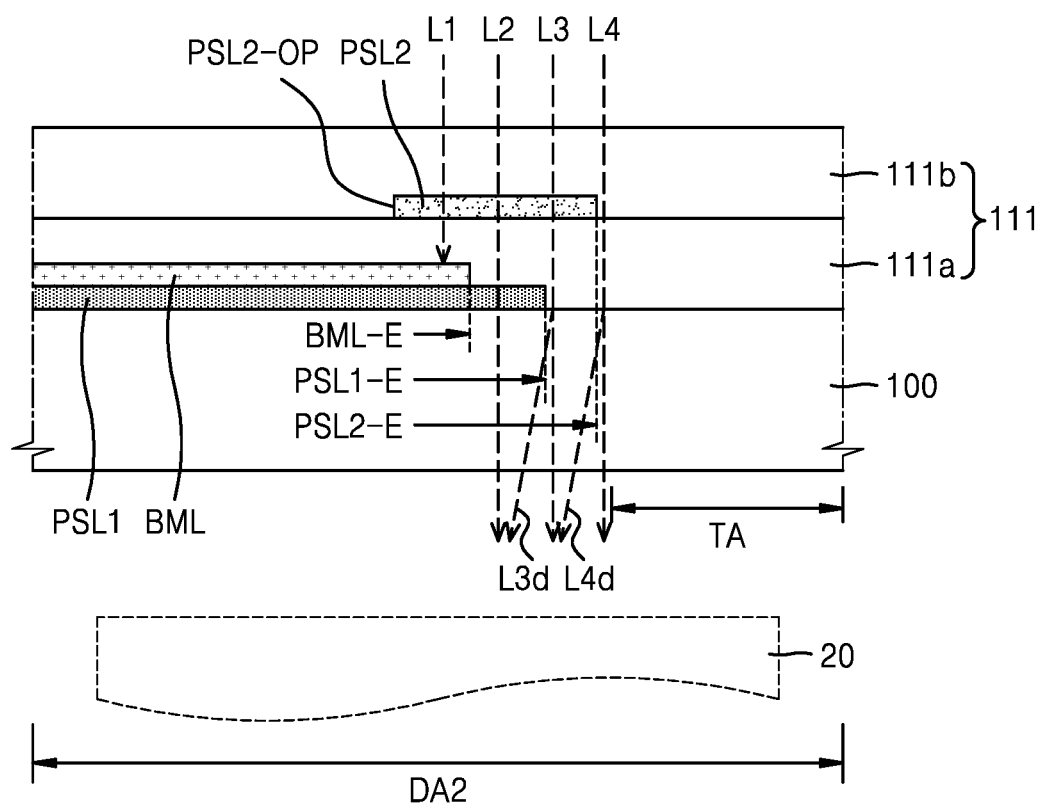
FIG. 13 is a schematic enlarged cross-sectional view of a portion of the display panel, according to another embodiment.
Figure 14:
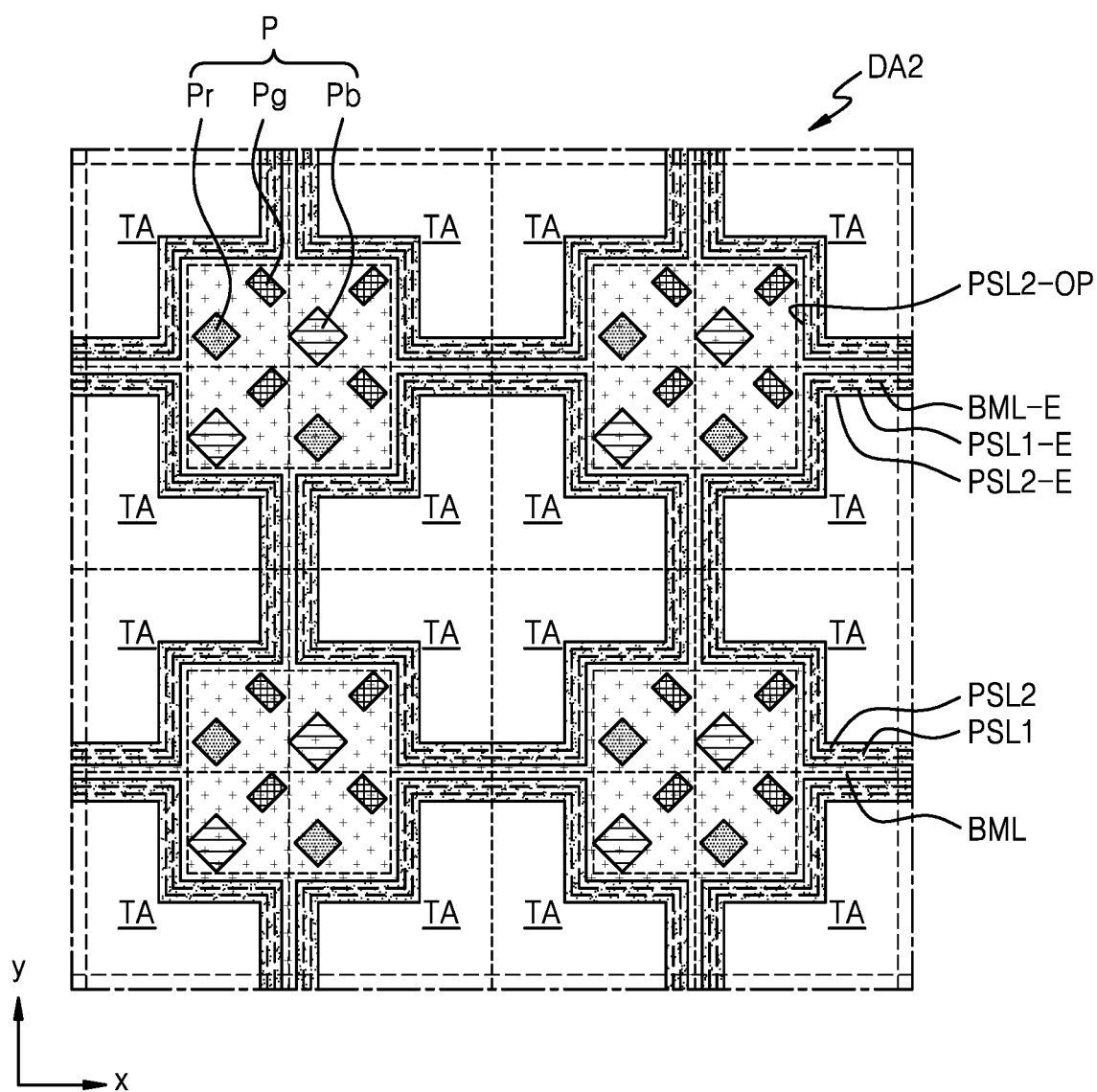
FIG. 14 is a schematic plan view of a portion of the second display area of the display panel, according to another embodiment.

FIG. 13 is a schematic enlarged cross-sectional view of a portion of the display panel, according to another embodiment, and FIG. 14 is a schematic plan view of a portion of the second display area of the display panel, according to another embodiment and corresponds to the embodiment of FIG. 13. A structure of the display panel according to the present embodiment is the same (e.g., substantially the same) as the structures described with reference to FIGS. 11 and 12, and a difference therebetween will be mainly described.

Referring to FIG. 13, the second phase shift layer PSL2 may overlap at least a portion of each of the first phase shift layer PSL1 and the light-blocking layer BML, and the second phase shift layer PSL2 may include an opening PSL2-OP overlapping the first phase shift layer PSL1 and the light-blocking layer BML. The second phase shift layer PSL2 may cover the edge BML-E of the light-blocking layer BML and the edge PSL1-E of the first phase shift layer PSL1, and the opening PSL2-OP of the second phase shift layer PSL2 may not overlap the edge BML-E of the light-blocking layer BML and the edge PSL1-E of the first phase shift layer PSL1.

Referring to FIG. 14, the first phase shift layer PSL1, the second phase shift layer PSL2, and the light-blocking layer BML are on the plane. The edge PSL2-E of the second phase shift layer PSL2 may be closer to the transmittance area TA than the edge PSL1-E of the first phase shift layer PSL1 and the edge BML-E of the light-blocking layer BML. The opening PSL2-OP of the second phase shift layer PSL2 may correspond to an area where the pixels P are arranged, and an area of the opening PSL2-OP may be smaller than that of the light-blocking layer BML. The opening PSL2-OP of the second phase shift layer PSL2 may help achieve cost-effectiveness compared to a case where the opening PSL2-OP is not included.

Figure 15:
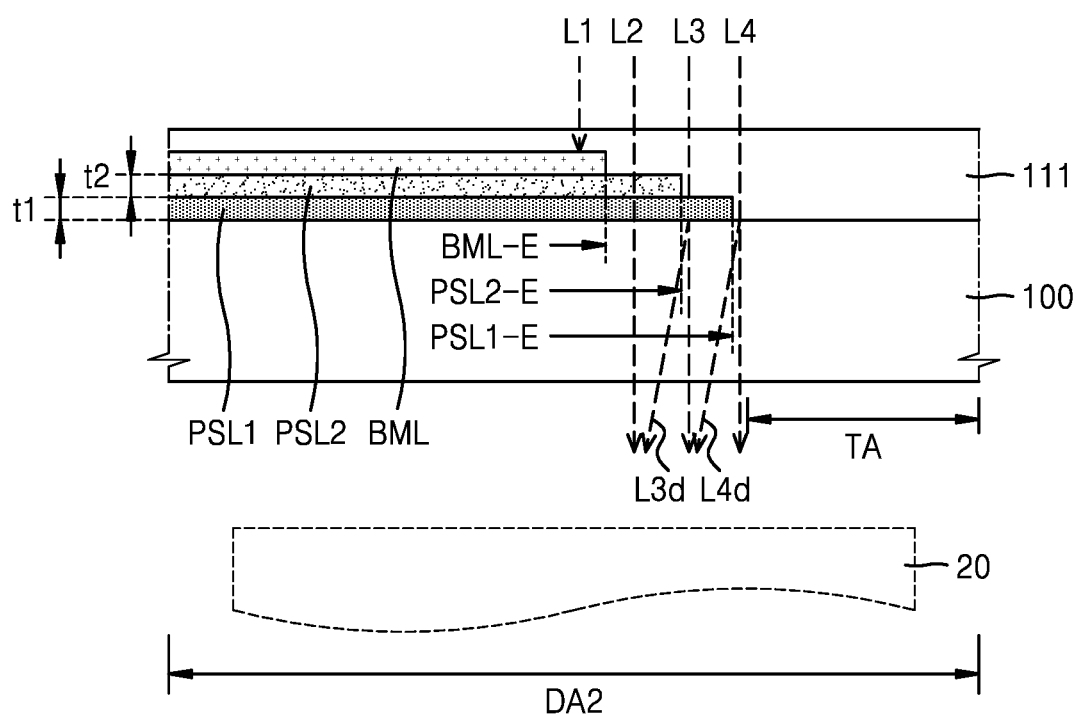
FIG. 15 is a schematic enlarged cross-sectional view of a portion of the display panel, according to another embodiment.

FIG. 15 is a schematic enlarged cross-sectional view of a portion of the display panel, according to another embodiment.

Referring to FIG. 15, the first phase shift layer PSL1 may be on the substrate 100, the light-blocking layer BML may be on the first phase shift layer PSL1, and the second phase shift layer PSL2 may be between the first phase shift layer PSL1 and the light-blocking layer BML.

The edge PSL1-E of the first phase shift layer PSL1 may be closer to the transmittance area TA than the edge PSL2-E of the second phase shift layer PSL2. Also, the edge PSL2-E of the second phase shift layer PSL2 may be closer to the transmittance area TA than the edge BML-E of the light-blocking layer BML. The edges PSL1-E, PSL2-E, and BML-E of the first phase shift layer PSL1, the second phase shift layer PSL2, and the light-blocking layer BML may form step differences.

The first phase shift layer PSL1 and the second phase shift layer PSL2 may have the first thickness t1 and the second thickness t2 that are different from each other. The first phase shift layer PSL1 and the second phase shift layer PSL2 may have the first and second refractive indices that are different from each other. The first phase shift layer PSL1 and the second phase shift layer PSL2 may each include at least one selected from the group consisting of transition metals, silicon compounds, transition metal oxides, transition metal nitrides, transition metal oxynitrides, transition metal carbides, and transition metal oxynitride carbides. The material and/or the composition ratio of the second phase shift layer PSL2 may differ from the material and/or the composition ratio of the first phase shift layer PSL1. A thickness, a refractive index, a material, and a composition of each of the first phase shift layer PSL1 and the second phase shift layer PSL2 may be determined to shift a phase of light in a set or certain wavelength band 180 degrees.

Referring to FIG. 15, the paths of light beams L1, L2, L3, and L4 among light beams that are incident to the display panel are indicated by dashed arrows. Because the first light beam L1 incident to the light-blocking layer BML fails to pass through the light-blocking layer BML, the light beam may not be incident to the electronic component 20 due to the light-blocking layer BML. The second light beam L2, which is incident to the area of the phase shift layer PSL that does not overlap the light-blocking layer BML, may penetrate the first and second phase shift layers PSL1 and PSL2 and may reach the electronic component 20 while the phase of the second light beam L2 is shifted 180 degrees in the first and second wavelength bands.

The light beam in the first wavelength band of the third light beam L3, which is incident to the area close to the edge PSL2-E of the second phase shift layer PSL2, has the phase shifted 180 degrees while passing through the first phase shift layer PSL1, and part of the third light beam L3 may be diffracted around the edge of the second phase shift layer PSL2. The diffracted light L3d may destructively interfere with a light beam of the second light beam L2, which is in the second wavelength band and of which the phase is inverted 180 degrees, and thus the distortion (e.g., image distortion) by the diffracted light of the light received by the electronic component 20 may be removed or may decrease.

Part of the fourth light beam L4, which is incident to the area close to the edge PSL1-E of the first phase shift layer PSL1, may be diffracted around the edge of the first phase shift layer PSL1. The diffracted light L4d may destructively interfere with a light beam of the third light beam L3, which is in the first wavelength band and of which the phase is inverted 180 degrees, and thus the distortion (e.g., image distortion) by the diffracted light of the light received by the electronic component 20 may be removed or may decrease.

Figure 16:
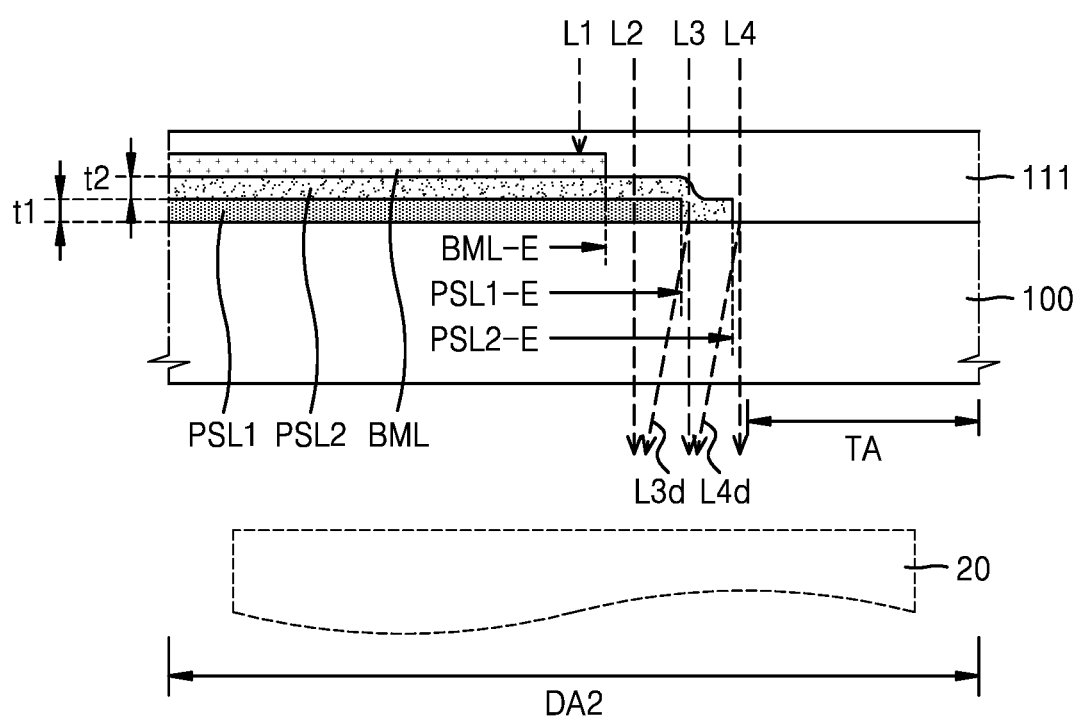
FIG. 16 is a schematic enlarged cross-sectional view of a portion of the display panel, according to another embodiment.

FIG. 16 is a schematic enlarged cross-sectional view of a portion of the display panel, according to another embodiment. The structure of the display panel of the present embodiment is the same (e.g., substantially the same) as that described with reference to FIG. 15, and a difference therebetween will be mainly described.

Referring to FIG. 16, the edge PSL1-E of the first phase shift layer PSL1 may be closer to the transmittance area TA than the edge BML-E of the light-blocking layer BML. The edge PSL2-E of the second phase layer PSL2 may be elongated further towards the transmittance area TA than the edge PSL1-E of the first phase shift layer PSL1. For example, the edge PSL2-E of the second phase shift layer PSL2 may be closer to the transmittance area TA than the edge PSL1-E of the first phase shift layer PSL1, and the second phase layer PSL2 may entirely cover the first phase shift layer PSL1.

Referring to FIG. 16, the paths of light beams L1, L2, L3, and L4 among the light beams that are incident to the display panel are indicated by dashed arrows. Because the first light L1 that is incident to the light-blocking layer BML may not pass through the light-blocking layer BML, the light may not be incident to the electronic component 20 due to the light-blocking layer BML. The second light beam L2, which is incident to the area where the first phase shift layer PSL1 and the second phase shift layer PSL2 overlap, may have a phase shifted 180 degrees in the first and second wavelength bands while passing through the first and second phase shift layers PSL1 and PSL2, thereby reaching the electronic component 20.

A light beam of the third light beam L3, which is in the second wavelength band and incident to the area close to the edge PSL1-E of the first phase shift layer PSL1, may have a phase shifted 180 degrees while passing through the second phase shift layer PSL2, and part of the third light beam L3 may be diffracted around the edge of the first phase shift layer PSL1. The diffracted light L3d may destructively interfere with a light beam of the second light beam L2, which is in the first wavelength band and of which the phase is inverted 180 degrees, and thus the distortion (e.g., image distortion) by the diffracted light of the light received by the electronic component 20 may be removed or may decrease.

Part of the fourth light beam L4, which is incident to the area close to the edge PSL2-E of the second phase shift layer PSL2 may be diffracted around the edge of the second phase shift layer PSL2. The diffracted light L4d may destructively interfere with the light beam of the third light beam L3, which is in the second wavelength band and of which the phase is inverted 180 degrees, and thus the distortion (e.g., image distortion) by the diffracted light of the light received by the electronic component 20 may be removed or may decrease.

Figure 17:
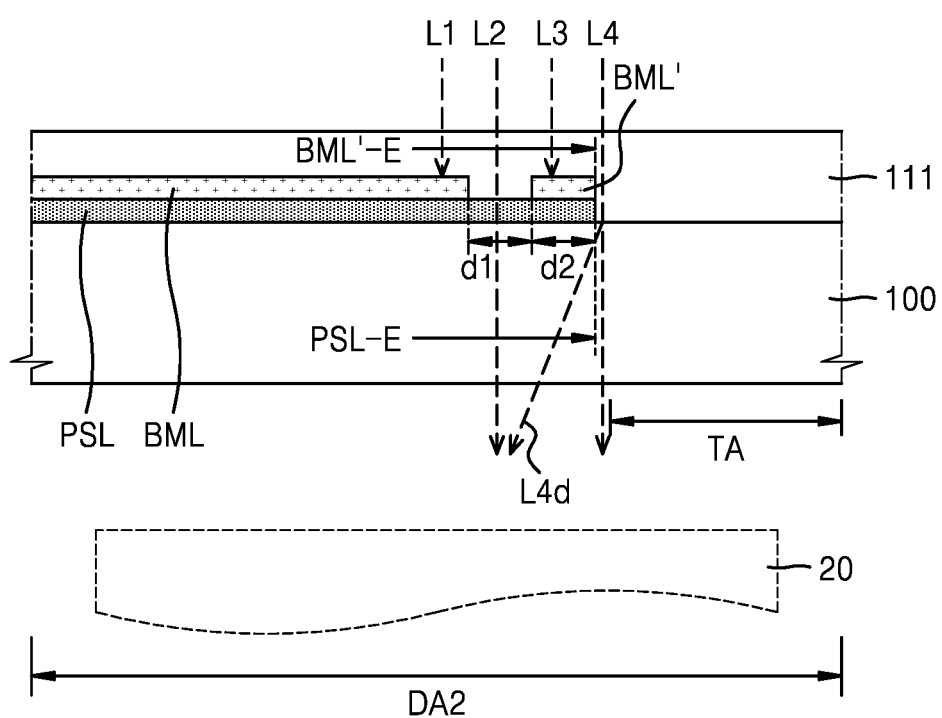
FIG. 17 is a schematic enlarged cross-sectional view of a portion of the display panel, according to another embodiment.
Figure 18:
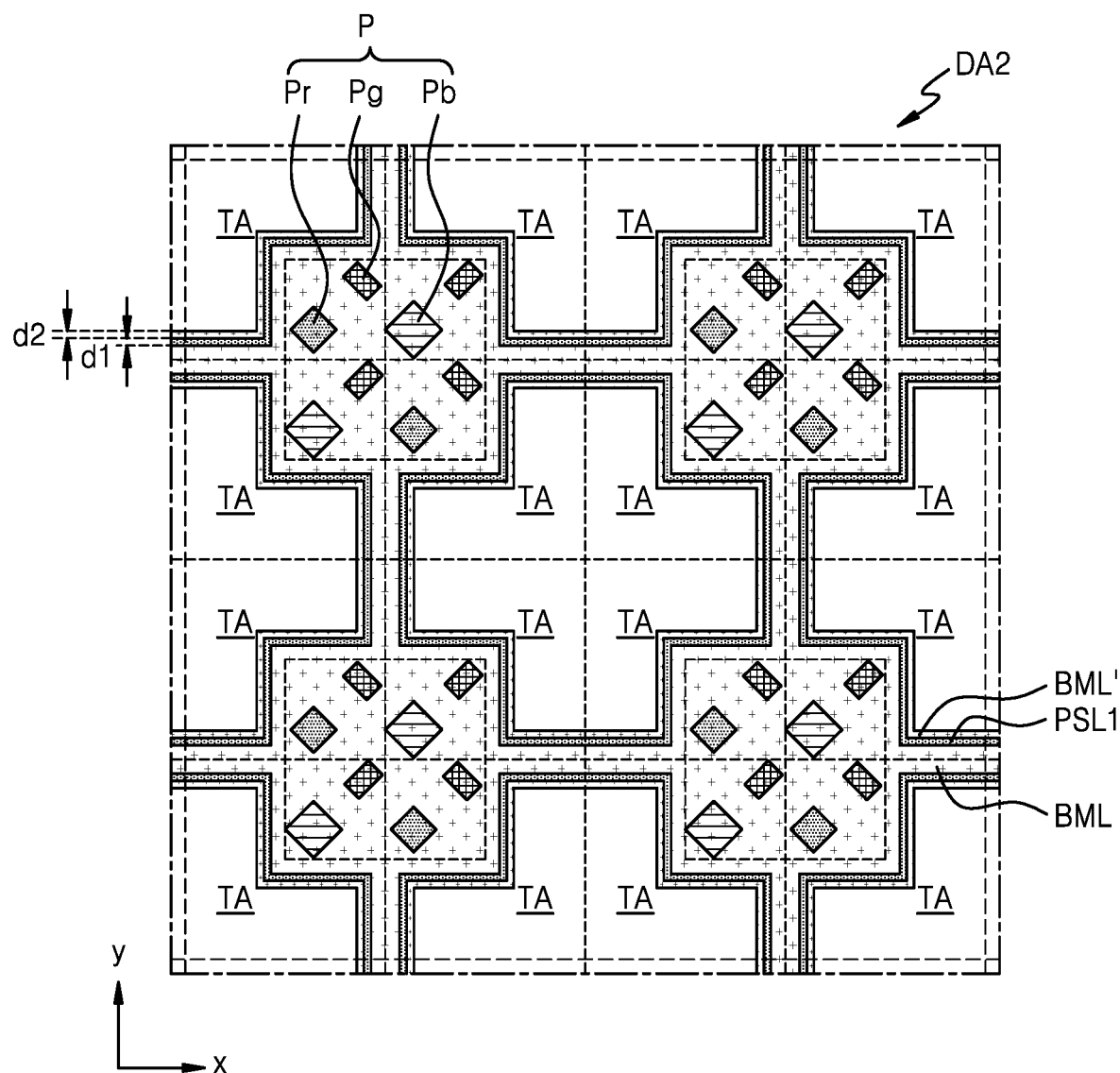
FIG. 18 is a schematic plan view of a portion of the second display area of the display panel, according to another embodiment.
Figure 19:
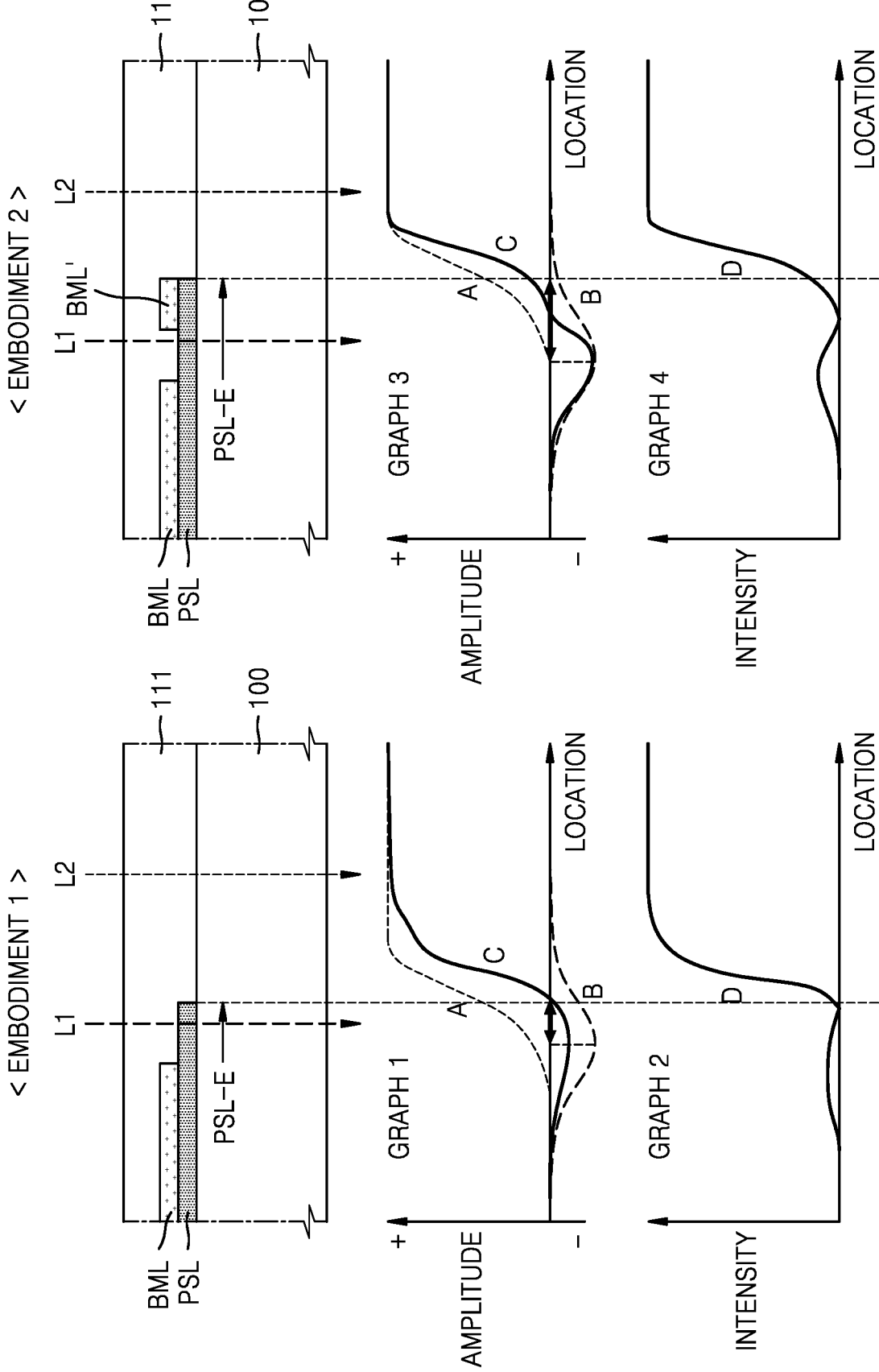
FIG. 19 shows schematic graphs of amplitudes and intensities of transmitted light according to a location of the display panel, according to an embodiment.

FIG. 17 is a schematic enlarged cross-sectional view of a portion of the display panel, according to another embodiment, and FIG. 18 is a schematic plan view of a portion of the second display area of the display panel, according to another embodiment and corresponds to the embodiment of FIG. 17. FIG. 19 shows schematic graphs of amplitudes and intensities of transmitted light according to a location of the display panel, according to an embodiment.

Referring to FIGS. 17 and 18, the phase shift layer PSL may be on the substrate 100, and the light-blocking layer BML and a light-blocking band layer BML' may be on the phase shift layer PSL. The light-blocking band layer BML' may be between the light-blocking layer BML and the transmittance area TA on a plane and may be spaced apart from the light-blocking layer BML.

A distance d1 between the light-blocking layer BML and the light-blocking band layer BML' may be between about 0.3 µm and about 5 µm, between about 0.5 µm and about 5 µm, between about 1 µm and about 5 µm, between about 2 µm and about 5 µm, between about 3 µm and about 5 µm, or between about 4 µm and about 5 µm. A width d2 of the light-blocking band layer BML' may be between about 0.3 µm and about 10 µm, between about 0.5 µm and about 10 µm, between about 1 µm and about 10 µm, between about 3 µm and about 10 µm, or between about 5 µm and about 10 µm.

The light-blocking band layer BML' may include the same (e.g., substantially the same) light-blocking material as the light-blocking layer BML. The light transmittance of the light-blocking band layer BML' may be less than that of the phase shift layer PSL. The light-blocking band layer BML' may include an edge BML'-E heading towards the transmittance area TA. The edge BML'-E of the light-blocking band layer BML' may be on the same plane as the edge PSL-E of the phase shift layer PSL.

Referring to FIG. 17, the paths of light beams L1, L2, L3, and L4 among the light beams that are incident to the display panel are indicated by dashed arrows. Because the first light beam L1 and the third light beam L3 that are incident to the light-blocking layer BML and the light-blocking band layer BML' may not pass through the light-blocking layer BML and the light-blocking band layer BML', the first light beam L1 and the third light beam L3 may not be incident to the electronic component 20 due to the light-blocking layer BML and the light-blocking band layer BML'. The light beam of the second light beam L2, which is in the set or certain wavelength band and incident to an area between the light-blocking layer BML and the light-blocking band layer BML' may have the phase shifted 180 degrees while passing through the phase shift layer PSL and may reach the electronic component 20. Part of the fourth light beam L4, which is incident to the area close to the edge PSL-E of the phase shift layer PSL, may be diffracted around the edge of the phase shift layer PSL. The diffracted light L4d may destructively interfere with a light beam of the second light beam L2, which is in a set or certain wavelength band and of which the phase is inverted 180 degrees, and thus the distortion (e.g., image distortion) by the diffracted light of the light received by the electronic component 20 may be removed or may decrease.

Referring to FIG. 19, an amplitude and an intensity of the transmitted light are shown according to the existence of the light-blocking band layer BML'. Graphs 1 and 2 correspond to Embodiment 1, and graphs 3 and 4 correspond to Embodiment 2. The horizontal axes of graphs 1 to 4 indicate corresponding locations according to a width direction (the x direction of FIG. 1) or a lengthwise direction (the y direction of FIG. 1) of the substrate. The vertical axes of graphs 1 and 3 indicate amplitudes of transmitted light, and + and − indicate that the phase of the transmitted light is shifted 180 degrees. The vertical axes of graphs 2 and 4 indicate intensities of transmitted light.

Referring to graphs 1 to 4, a curved line A (indicated by a thin dashed line) indicates a size of an amplitude of light in a set or certain wavelength band which is included in the second light beam (L2, indicated by an arrow of a thin dashed line) that is incident to an area where the phase shift layer PSL is not located. A curved line B (indicated by a thick dashed line) indicates an amplitude of light in a set or certain wavelength which is included in the first light beam (L1, indicated by a thick dashed line) and has a phase shifted 180 degrees. A curved line C indicates a sum of the curved line A and the curved line B. A curved line D indicates an intensity of the light of the transmitted light which is in the set or certain wavelength band, and the intensity may be in proportion to a square of a size of an amplitude.

The first light beam L1 of the transmitted light may have a phase shifted 180 degrees in a set or certain wavelength band while passing through the phase shift layer PSL, and the second light beam L2 of the transmitted light that does not pass through the phase shift layer PSL may be incident without a phase shift. The light of the first light beam L1, which is in a set or certain wavelength band and has a phase shifted 180 degrees, may be diffracted after passing through the phase shift layer PSL and may destructively interfere with the light of the second light beam L2 in a set or certain wavelength band in an area close to the edge PSL-E of the phase shift layer PSL. Referring to the curved line C of graph 1 and the curved line D of graph 2, the amplitude and intensity of the light in the set or certain wavelength band may decrease due to the destructive interference in the area close to the edge of the phase shift layer PSL.

Compared with Embodiment 1 in which a light-blocking band portion is not included, according to Embodiment 2 in which the light-blocking band portion is included, a location, where a size of an amplitude of the light of the first light beam L1 in a set or certain wavelength band and having a phase shifted 180 degrees is the greatest (e.g., a location where an absolute value of the amplitude of the curved line B of graph 3 is the greatest), may be further from the edge PSL-E of the phase shift layer PSL. Therefore, in the area close to the edge PSL-E of the phase shift layer PSL, a loss of the transmitted light may decrease. By reducing the loss of the transmitted light, the performance degradation of the electronic component (20 of FIG. 2) may also decrease.

According to Embodiment 2, for example, to achieve a greater destructive interference effect by increasing the light transmittance of the phase shift layer PSL (e.g., equal to or greater than 30%), the loss of the transmitted light may be reduced in the area close to the edge PSL-E of the phase shift layer PSL to thereby decrease the performance degradation of the electronic component (20 of FIG. 2).

Figure 20:
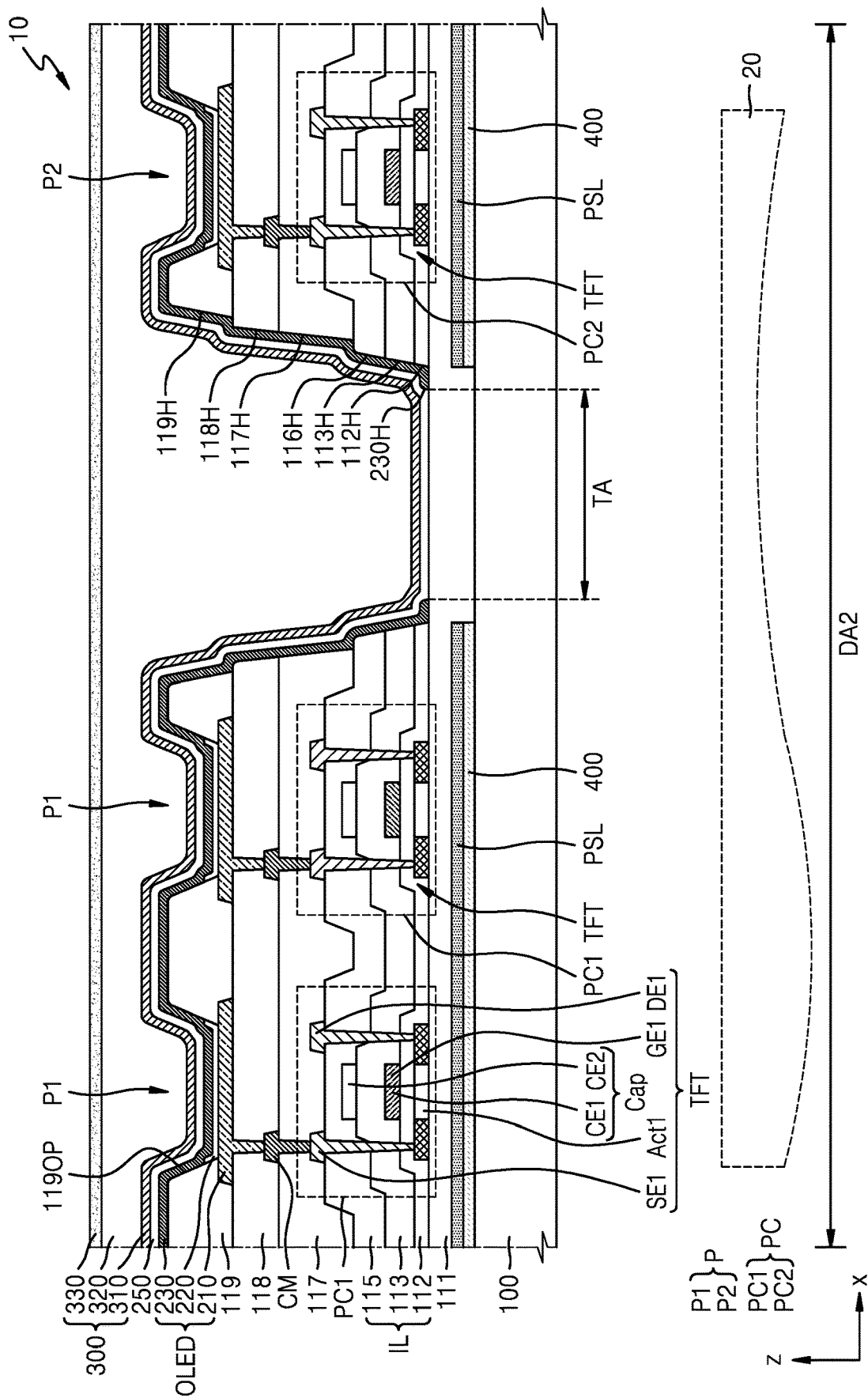
FIG. 20 is a schematic cross-sectional view of a portion of the display panel, according to another embodiment.

FIG. 20 is a schematic cross-sectional view of a portion of the display panel, according to another embodiment. Because a structure of the display panel is the same (e.g., substantially the same) as that described with reference to FIG. 6, a difference therebetween will be mainly described.

Referring to FIG. 20, a reflection prevention layer 400 may be under the phase shift layer PSL, corresponding to the pixel circuit. The reflection prevention layer 400 may include chromium oxide, etc. The reflection prevention layer 400 may have lower reflectivity than the phase shift layer. The reflection prevention layer 400 may prevent or reduce reflection of light, which is incident to the transmittance area TA, from a surface of the electronic component 20 and is a bad influence on (e.g., may damage or deteriorate) the thin film transistor TFT, the pixel circuit PC, and/or the like.

According to the one or more embodiments described above, the display apparatus, of which the display area is expanded for the representation of images in the area where the electronic component is located, and an electronic apparatus including the display apparatus may be realized. For example, when the electronic component is an electronic component (e.g., a camera) that uses light, the distortion (e.g., image distortion) by the diffracted light among the light received by the electronic component may be removed or may decrease. Furthermore, a display panel capable of providing high-quality images and an electronic apparatus including the display panel may be provided. However, the scope of the disclosure is not limited by the above effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and equivalents thereof.

What is claimed is:

1. A display panel having a transmittance area and comprising:
   a substrate;
   first pixel circuits and second pixel circuits on the substrate and spaced apart from one another with the transmittance area therebetween, and each comprising a thin film transistor and a storage capacitor;
   first display elements electrically respectively coupled to the first pixel circuits;
   second display elements electrically respectively coupled to the second pixel circuits; and
   a first phase shift layer between the substrate and the first pixel circuits and between the substrate and the second pixel circuits and having a first light transmittance,
   wherein the first phase shift layer does not extend through the transmittance area.

2. The display panel of claim 1, wherein the first phase shift layer comprises at least one selected from the group consisting of transition metals, silicon compounds, transition metal oxides, transition metal nitrides, transition metal oxynitrides, transition metal carbides, and transition metal oxynitride carbides.

3. The display panel of claim 1, wherein the first light transmittance of the first phase shift layer in a visible light band is in a range of about 3 and about 80.

4. The display panel of claim 1, wherein a first thickness of the first phase shift layer has a value in a range of about 1000 Å to about 3000 Å.

5. The display panel of claim 1, wherein a first refractive index of the first phase shift layer is in a range of about 1.5 and about 4.0, and
   a first extinction coefficient of the first phase shift layer is in a range of about 0.01 and about 2.0.

6. The display panel of claim 1, wherein the first phase shift layer comprises a first sub-phase shift layer overlapping the first pixel circuit, and a second sub-phase shift layer overlapping the second pixel circuit, and
   the first sub-phase shift layer and the second sub-phase shift layer are spaced apart from each other.

7. The display panel of claim 1, further comprising a light-blocking layer on the first phase shift layer,
   wherein the light-blocking layer has a second light transmittance that is less than the first light transmittance.

8. The display panel of claim 7, wherein an edge of the first phase shift layer is closer to the transmittance area than an edge of the light-blocking layer, and the edge of the first phase shift layer and the edge of the light-blocking layer form a step difference.

9. The display panel of claim 7, further comprising a second phase shift layer on the light-blocking layer and overlapping the light-blocking layer and the first phase shift layer.

10. The display panel of claim 9, wherein an edge of the second phase shift layer is closer to the transmittance area than the edge of the first phase shift layer.

11. The display panel of claim 9, wherein each of the first phase shift layer and the second phase shift layer comprises at least one selected from the group consisting of transition metals, silicon compounds, transition metal oxides, transition metal nitrides, transition metal oxynitrides, transition metal carbides, and transition metal oxynitride carbides, and
    a material or a composition ratio of the second phase shift layer differs from a material or a composition ratio of the first phase shift layer.

12. The display panel of claim 7, further comprising a second phase shift layer between the first phase shift layer and the light-blocking layer.

13. The display panel of claim 12, wherein the edge of the first phase shift layer is closer to the transmittance area than an edge of the second phase shift layer.

14. The display panel of claim 12, wherein the edge of the second phase shift layer is elongated further towards the transmittance area than the edge of the first phase shift layer.

15. The display panel of claim 7, further comprising a light-blocking band layer between the light-blocking layer and the transmittance area and spaced apart from the light-blocking layer.

16. A display panel having a transmittance area and comprising:
    a substrate;
    first pixel circuits and second pixel circuits on the substrate and spaced apart from one another with the transmittance area therebetween, and each comprising a thin film transistor and a storage capacitor;
    first display elements electrically respectively coupled to the first pixel circuits;
    second display elements electrically respectively coupled to the second pixel circuits;
    a first phase shift layer between the substrate and the first pixel circuits and between the substrate and the second pixel circuits and having a first light transmittance; and
    a reflection prevention layer under the first phase shift layer, corresponding to the pixel circuit.

17. An electronic apparatus comprising:
    a display panel comprising a transmittance area; and
    an electronic component overlapping the transmittance area,
    wherein the display panel comprises:
    a substrate;
    first pixel circuits and second pixel circuits on the substrate and spaced apart from each other with the transmittance area between the first and second pixel circuits, and each comprising a thin film transistor and a storage capacitor;
    first display elements electrically respectively coupled to the first pixel circuits;
    second display elements electrically respectively coupled to the second pixel circuits; and
    a first phase shift layer between the substrate and the first pixel circuits and between the substrate and the second pixel circuits and having a first light transmittance,
    wherein the first phase shift layer does not extend through the transmittance area.

18. The electronic apparatus of claim 17, further comprising a light-blocking layer on the first phase shift layer,
    wherein an edge of the first phase shift layer is closer to the transmittance area than an edge of the light-blocking layer, and
    the edge of the first phase shift layer and the edge of the light-blocking layer form a step difference.

19. The electronic apparatus of claim 18, further comprising a second phase shift layer on the first phase shift layer.

20. The electronic apparatus of claim 19, wherein each of the first phase shift layer and the second phase shift layer comprises at least one selected from the group consisting of transition metals, silicon compounds, transition metal oxides, transition metal nitrides, transition metal oxynitrides, transition metal carbides, and transition metal oxynitride carbides, and
    a material or a composition ratio of the second phase shift layer differs from a material or a composition ratio of the first phase shift layer.

* * * * *